United States Patent
Kim et al.

(10) Patent No.: US 8,872,262 B2
(45) Date of Patent: Oct. 28, 2014

(54) SEMICONDUCTOR INTEGRATED CIRCUIT DEVICES INCLUDING GATES HAVING CONNECTION LINES THEREON

(75) Inventors: Bong-Soo Kim, Seongnam-si (KR); Hyeong-Sun Hong, Seongnam-si (KR); Soo-Ho Shin, Yongin-si (KR); Ho-In Ryu, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 518 days.

(21) Appl. No.: 12/781,859

(22) Filed: May 18, 2010

(65) Prior Publication Data
US 2010/0221875 A1 Sep. 2, 2010

Related U.S. Application Data

(62) Division of application No. 11/852,940, filed on Sep. 10, 2007, now Pat. No. 7,745,876.

(30) Foreign Application Priority Data

Feb. 21, 2007 (KR) .................. 10-2007-0017585
Feb. 27, 2007 (KR) .................. 10-2007-0019755

(51) Int. Cl.
  *H01L 27/108* (2006.01)
  *H01L 27/02* (2006.01)
  *H01L 29/78* (2006.01)

(52) U.S. Cl.
  CPC ......... *H01L 27/0207* (2013.01); *H01L 29/7833* (2013.01); *H01L 27/10876* (2013.01); *H01L 27/10894* (2013.01)
  USPC .................................. 257/330; 257/E27.097

(58) Field of Classification Search
  None
  See application file for complete search history.

(56) References Cited

U.S. PATENT DOCUMENTS

| 6,150,689 A | 11/2000 | Narui et al. |
| 6,770,535 B2 * | 8/2004 | Yamada et al. ............... 438/270 |
| 6,939,765 B2 | 9/2005 | Kime et al. |
| 7,282,399 B2 * | 10/2007 | Takahashi ..................... 438/149 |
| 2001/0025973 A1 | 10/2001 | Yamada et al. |

(Continued)

FOREIGN PATENT DOCUMENTS

| JP | 7-66297 | 3/1995 |
| JP | 2002-261256 A | 9/2002 |
| JP | 2004-095745 A | 3/2004 |
| JP | 2005-039270 A | 2/2005 |

(Continued)

OTHER PUBLICATIONS

First Office Action, corresponding Taiwanese Patent Application No. 096138520; Jan. 17, 2014.

*Primary Examiner* — Benjamin Sandvik
(74) *Attorney, Agent, or Firm* — Myers Bigel Sibley & Sajovec, P.A.

(57) ABSTRACT

Provided are semiconductor integrated circuit (IC) devices including gate patterns having a step difference therebetween and a connection line interposed between the gate patterns. The semiconductor IC device includes a semiconductor substrate including a peripheral active region, a cell active region, and a device isolation layer. Cell gate patterns are disposed on the cell active region and the device isolation layer. A peripheral gate pattern is disposed on the peripheral active region. A cell electrical node is disposed on the cell active region adjacent to the cell gate patterns. Peripheral electrical nodes are disposed on the peripheral active region adjacent to the peripheral gate pattern. Connection lines are disposed on the cell gate patterns disposed on the device isolation layer. The connection lines are connected between the cell gate patterns and the peripheral gate pattern.

23 Claims, 29 Drawing Sheets

(56) References Cited

U.S. PATENT DOCUMENTS

| | | |
|---|---|---|
| 2003/0011032 A1 | 1/2003 | Umebayashi |
| 2003/0062550 A1* | 4/2003 | Sekiguchi et al. ............ 257/208 |
| 2003/0089961 A1* | 5/2003 | Vollrath et al. ............... 257/510 |
| 2005/0275014 A1 | 12/2005 | Kim et al. |
| 2006/0097314 A1 | 5/2006 | Uchiyama |
| 2007/0082440 A1 | 4/2007 | Shiratake |
| 2007/0284647 A1 | 12/2007 | Seo et al. |
| 2008/0048333 A1* | 2/2008 | Seo et al. ..................... 257/773 |
| 2008/0191288 A1 | 8/2008 | Kwon et al. |
| 2008/0203587 A1 | 8/2008 | Seo et al. |
| 2009/0114991 A1* | 5/2009 | Kim et al. .................... 257/365 |

FOREIGN PATENT DOCUMENTS

| | | |
|---|---|---|
| KR | 1999-0040755 | 6/1999 |
| KR | 2000-0015029 | 3/2000 |
| KR | 2001-0029029 | 4/2001 |
| KR | 2002-0053538 | 7/2002 |
| KR | 2002-0061061 | 7/2002 |
| KR | 10-2005-0027294 | 3/2005 |
| KR | 10-2005-0062019 | 6/2005 |
| KR | 10-2005-73099 | 7/2005 |
| KR | 10-2005-0101993 | 10/2005 |
| KR | 10-2006-0033961 | 4/2006 |
| KR | 10-2006-0042499 | 5/2006 |
| TW | 1278969 | 4/2007 |

* cited by examiner

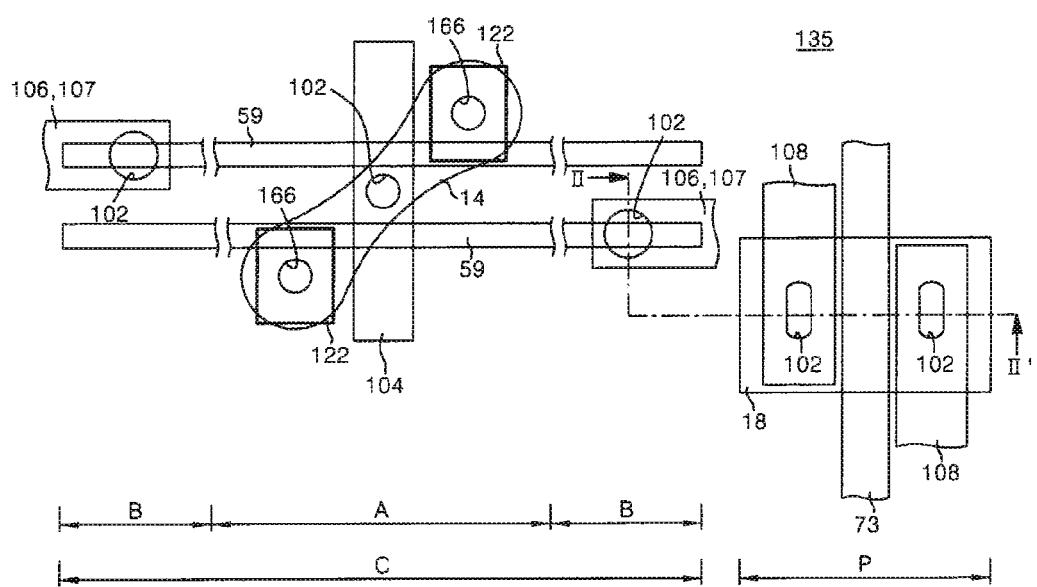

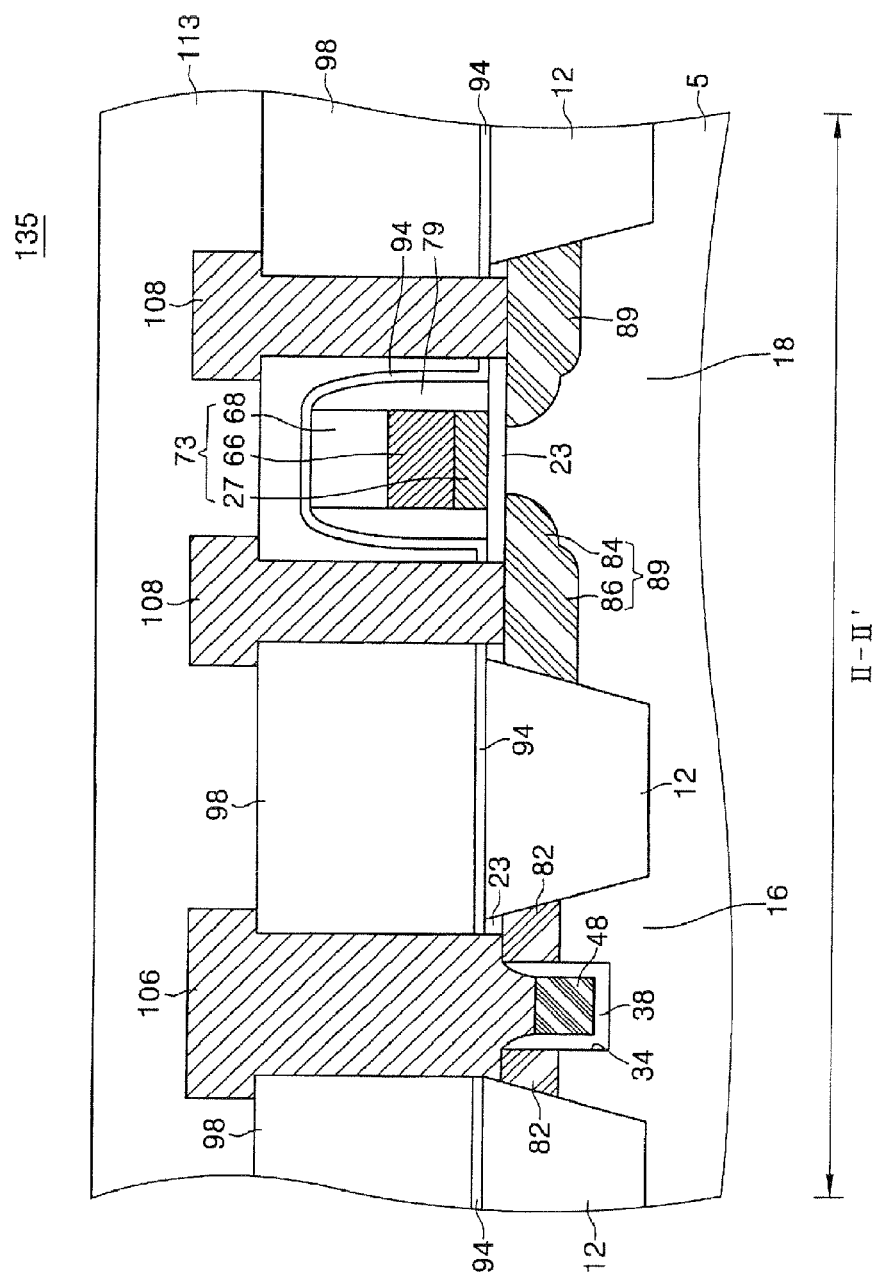

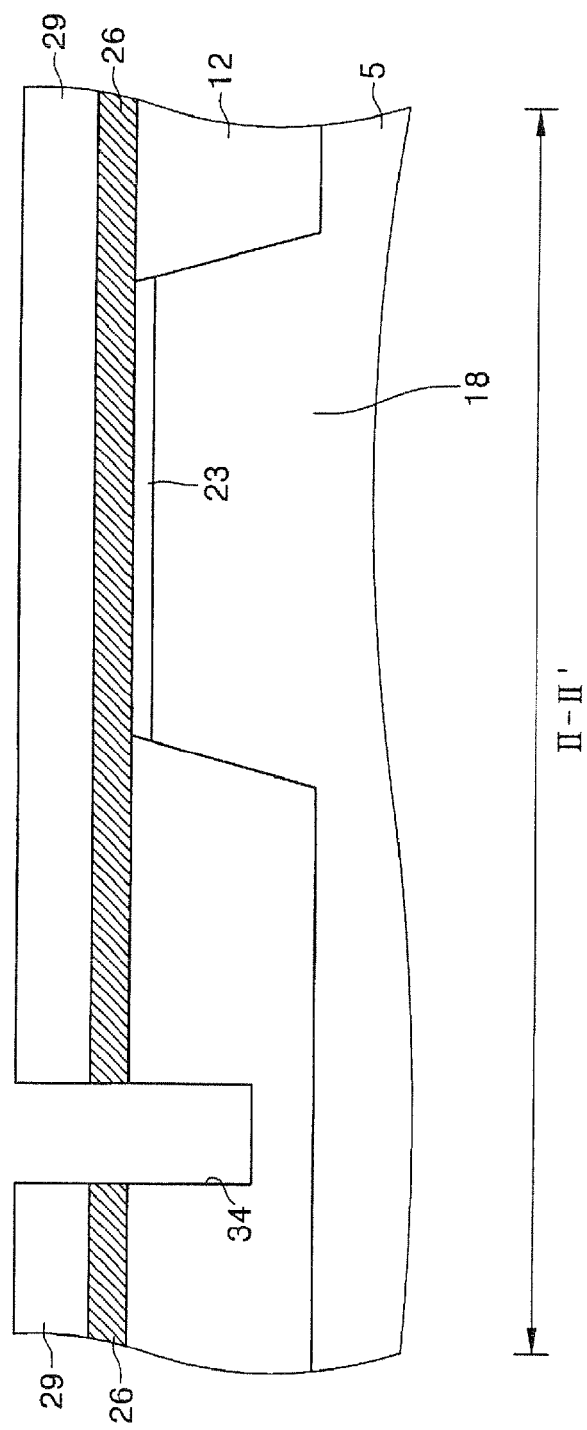

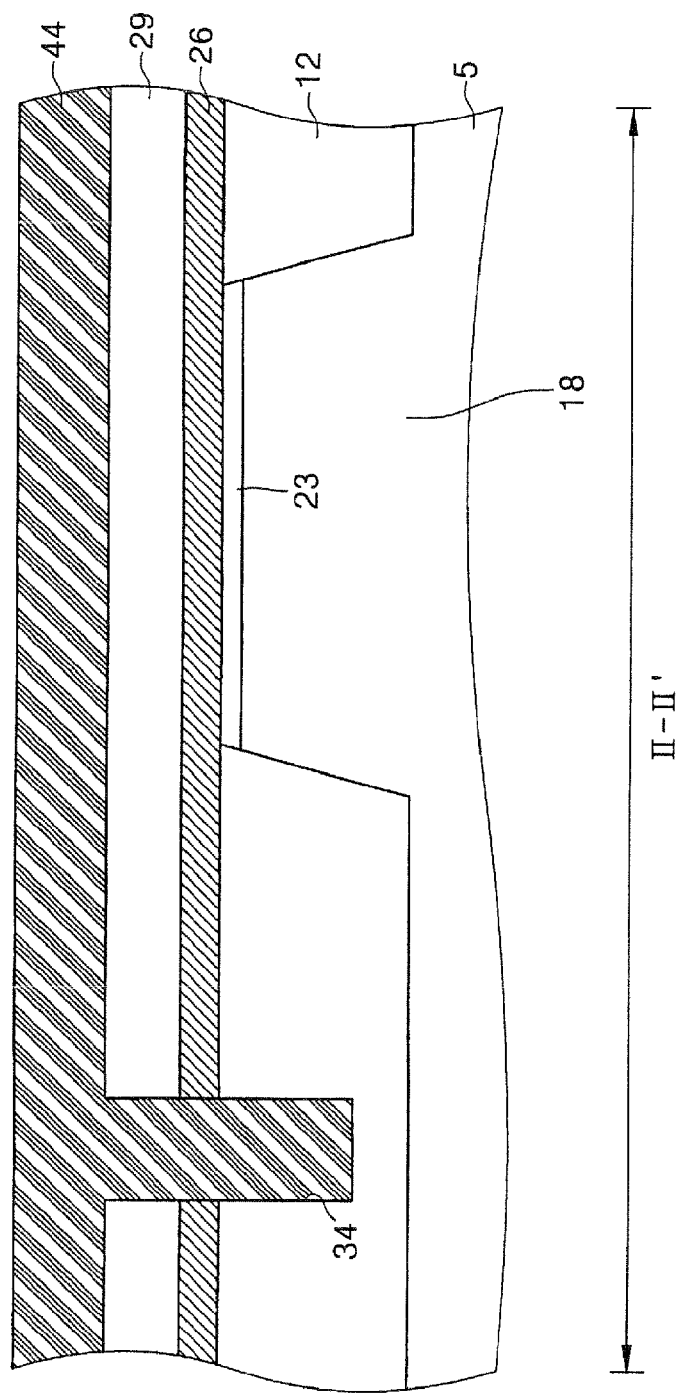

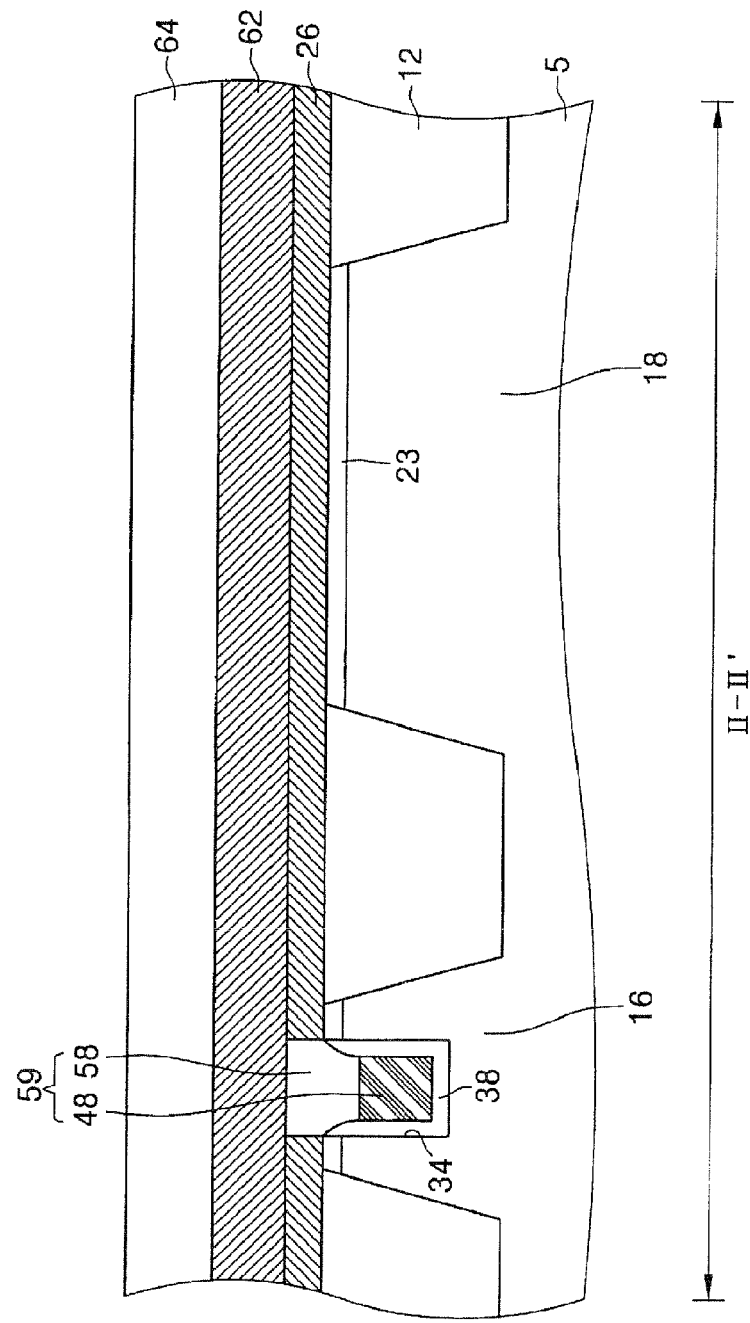

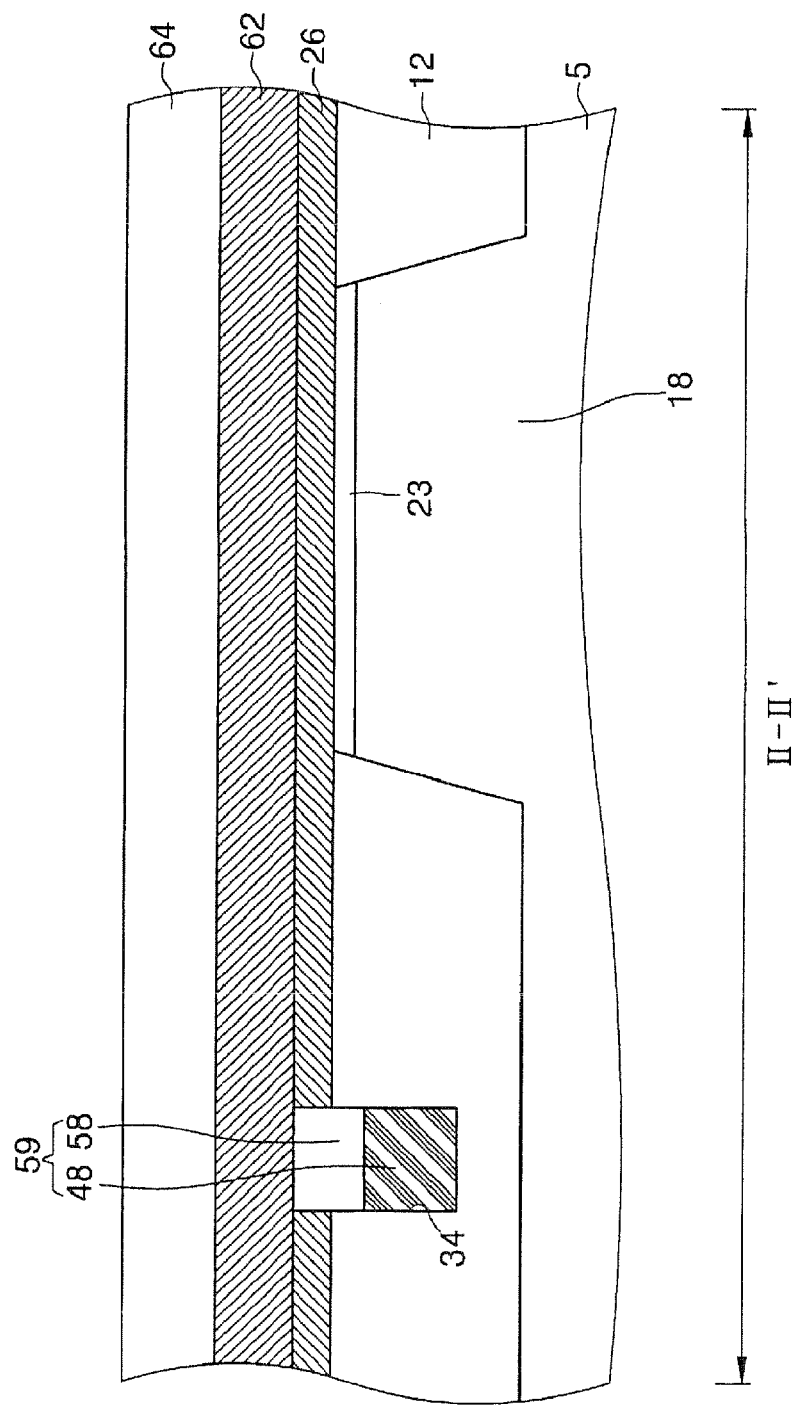

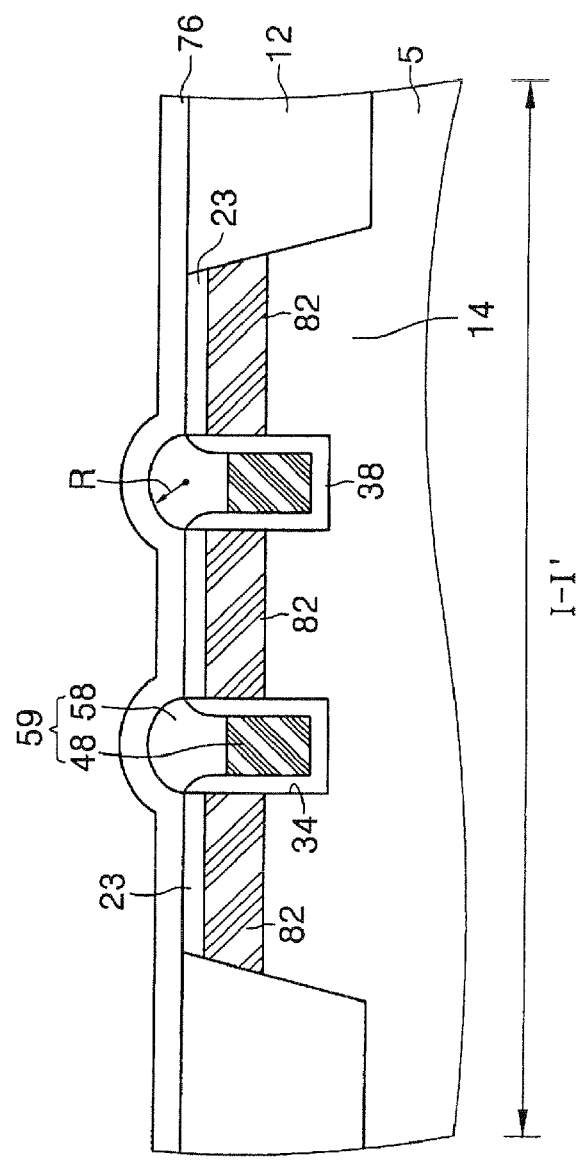

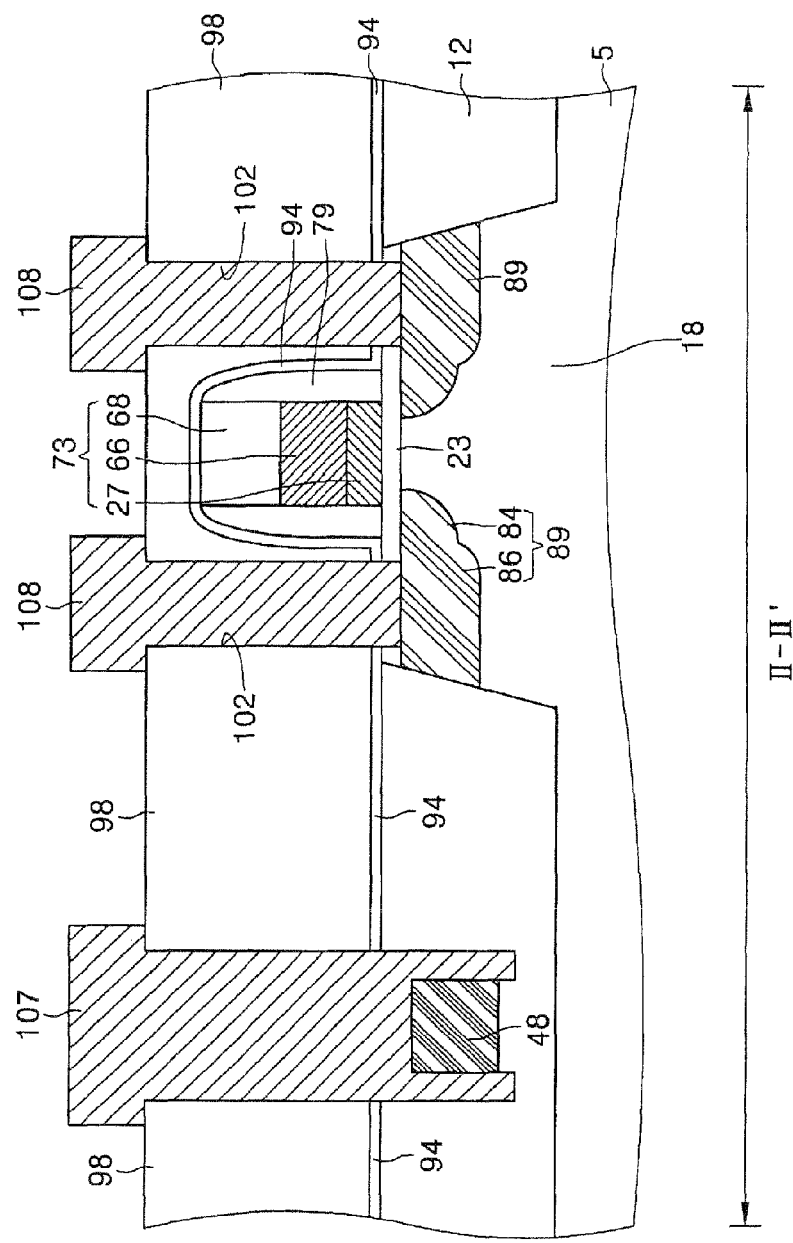

SEMICONDUCTOR INTEGRATED CIRCUIT DEVICES INCLUDING GATES HAVING CONNECTION LINES THEREON

CROSS-REFERENCE TO RELATED APPLICATIONS

This patent application is a divisional of application Ser. No. 11/852,940 filed Sep. 10, 2007 which claims priority under 35 USC §119 to Korean Patent Application Nos. 10-2007-0017585 and 10-2007-0019755, filed on Feb. 21, 2007 and Feb. 27, 2007, respectively, the disclosures of which are hereby incorporated herein by reference in their entirety.

BACKGROUND

1. Technical Field

The present invention relates to semiconductor integrated circuit (IC) devices and methods of fabricating the same and, more particularly, to semiconductor IC devices including gate patterns having a step difference therebetween and a connection line interposed between the gate patterns and methods of fabricating the same.

2. Description of the Related Art

Typically, a semiconductor IC device is fabricated by forming gate patterns in a cell array region and a peripheral circuit region into which a semiconductor substrate is divided. In this case, the semiconductor substrate includes active regions and a device isolation layer, which are disposed in the cell array region and the peripheral circuit region. Due to a reduction in the design rule, the semiconductor IC device includes a gate pattern disposed under top surfaces of the active region and the device isolation layer in the cell array region and another gate pattern disposed on a top surface of the active region in the peripheral circuit region. Thus, the gate pattern disposed in the cell array region constitutes a 3-dimensional transistor in the semiconductor IC device. The semiconductor IC device can improve current drivability using the gate pattern disposed in the cell array region compared with before the reduction in the design rule.

However, with continuing reduction in the design rule, the semiconductor IC device may not have gate patterns that improve current drivability. This is due to the fact that the gate patterns disposed in the cell array region and the peripheral circuit region are simultaneously formed under and on the top surface of the active region, respectively, in order to simplify a semiconductor fabrication process. Thus, since the gate patterns have a step difference therebetween relative to the top surface of the active region, the semiconductor fabrication process may attack the gate pattern disposed in the cell array region and/or the gate pattern disposed in the peripheral circuit region according to process circumstances. As a result, the gate pattern disposed in the cell array region and/or the gate pattern disposed in the peripheral circuit region may be attacked and undesirably shaped during the semiconductor fabrication process.

The above-described gate patterns have been disclosed in U.S. Patent Publication No. 2006/0097314 by Hiroyuki Uchiyama. According to U.S. Patent Publication No. 2006/0097314, a semiconductor substrate having a memory cell region and a peripheral circuit region is prepared. An isolated trench is disposed in the memory cell region and the peripheral circuit region. The isolated trench is filled with a silicon oxide layer. The silicon oxide layer defines an active region disposed in the memory cell region and an active region disposed in the peripheral circuit region. Gate electrodes are disposed on the active regions and protrude from top surfaces of the active regions, respectively. The gate electrodes are formed of a conductive material. Caps are disposed on the gate electrodes, respectively. The caps are formed of an insulating material. Contact plugs are disposed adjacent to the gate electrodes and contact the active regions, respectively. The contact plugs are formed of a conductive material.

However, according to U.S. Patent Publication No. 2006/0097314, a semiconductor device may not improve current drivability along with a reduction in the design rule because the gate electrodes disposed in the memory cell region protrude from the top surface of the active region. In other words, with the continual shrinkage of design rules, the gate electrodes may greatly increase parasitic capacitances along with the contact plugs in the memory cell region and the peripheral circuit region. Specifically, the gate electrodes disposed in the memory cell region may have short circuits with the contact plugs on the active regions of the memory cell region due to the continual shrinkage of design rules. As a result, the contact plugs may increase the internal resistances of the gate electrodes in the memory cell region, thereby degrading the current drivability of the semiconductor device. The present invention addresses these and other disadvantages of the conventional art.

SUMMARY

In one aspect, an embodiment of the present invention is directed to a semiconductor IC device including gate patterns having a step difference therebetween a-d connection lines interposed between the gate patterns. The semiconductor IC device includes a semiconductor substrate having a peripheral circuit region and a cell array region. The cell array region is divided into a cell edge region and a cell central region. The cell central region is substantially surrounded by the cell edge region. The cell edge region is substantially surrounded by the peripheral circuit region. A device isolation layer is disposed in the peripheral circuit region, the cell edge region, and the cell central region. The device isolation layer defines cell active regions in the cell central region and the cell edge region and defines a peripheral active region in the peripheral circuit region. A peripheral gate pattern is disposed on the peripheral active region of the peripheral circuit region. The peripheral gate pattern extends upward from a top surface of the peripheral active region. Cell gate patterns are disposed respectively in the cell active regions of the cell central region and the cell edge region. The cell gate patterns protrude into the cell active regions, respectively. A connection line contacts the cell gate pattern and the cell active region of the cell edge region.

Thus, embodiments of the present invention provide semiconductor IC devices including gate patterns with a step difference therebetween disposed in a cell array region and a peripheral circuit region and a connection line interposed between the gate patterns. By forming the gate patterns having the step difference therebetween in the cell array region and the peripheral circuit region and forming the connection lines between the cell array region and the peripheral circuit region using different process operations, the current drivability of the semiconductor IC device can be improved, compared with the conventional methods.

BRIEF DESCRIPTION OF THE DRAWINGS

The foregoing and other objects, features and advantages of the invention will be apparent from the description of exemplary embodiments of the invention along with the accompanying drawings. The drawings are not necessarily to scale, emphasis instead being placed upon illustrating the principles of the invention.

FIGS. 1A and 1B are layout views showing a semiconductor integrated circuit (IC) device according to some embodiments of the present invention.

FIG. 2B is a cross-sectional view showing a semiconductor IC device taken along line II-II' of FIG. 1A according to some embodiments of the present invention.

FIGS. 3A through 10A are cross-sectional views illustrating a method of fabricating a semiconductor IC device taken along line I-I' of FIG. 1A according to some embodiments of the present invention.

FIGS. 3B through 10B are cross-sectional views illustrating a method of fabricating a semiconductor IC device taken along line II-II' of FIG. 1A according to some embodiments of the present invention.

FIGS. 3C through 10C are cross-sectional views illustrating a method of fabricating a semiconductor IC device taken along line II-II' of FIG. 1B according to some embodiments of the present invention.

DETAILED DESCRIPTION

Semiconductor integrated circuit (IC) devices including gate patterns having a step difference therebetween and a connection line interposed between the gate lines and methods of fabricating the same according to the present invention will now be described more fully hereinafter with reference to the accompanying drawings, in which exemplary embodiments of the invention are shown.

Figure 1A:
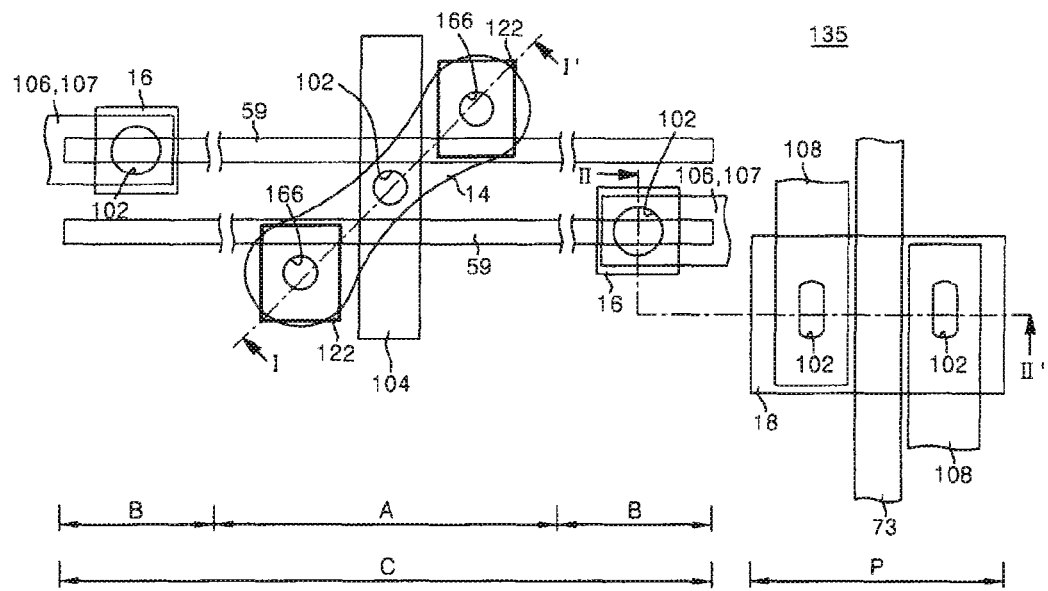
Figure 2A:
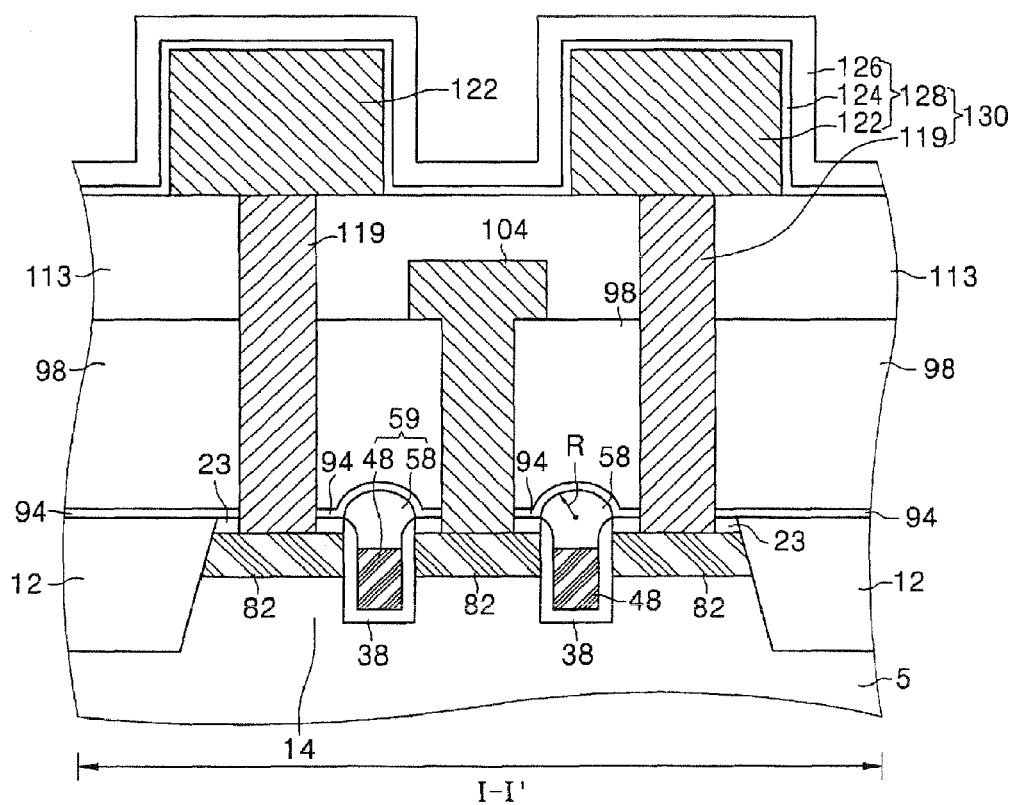
FIG. 2A is a cross-sectional view showing a semiconductor IC device taken along line I-I' of FIG. 1A according to some embodiments of the present invention.
Figure 2C:
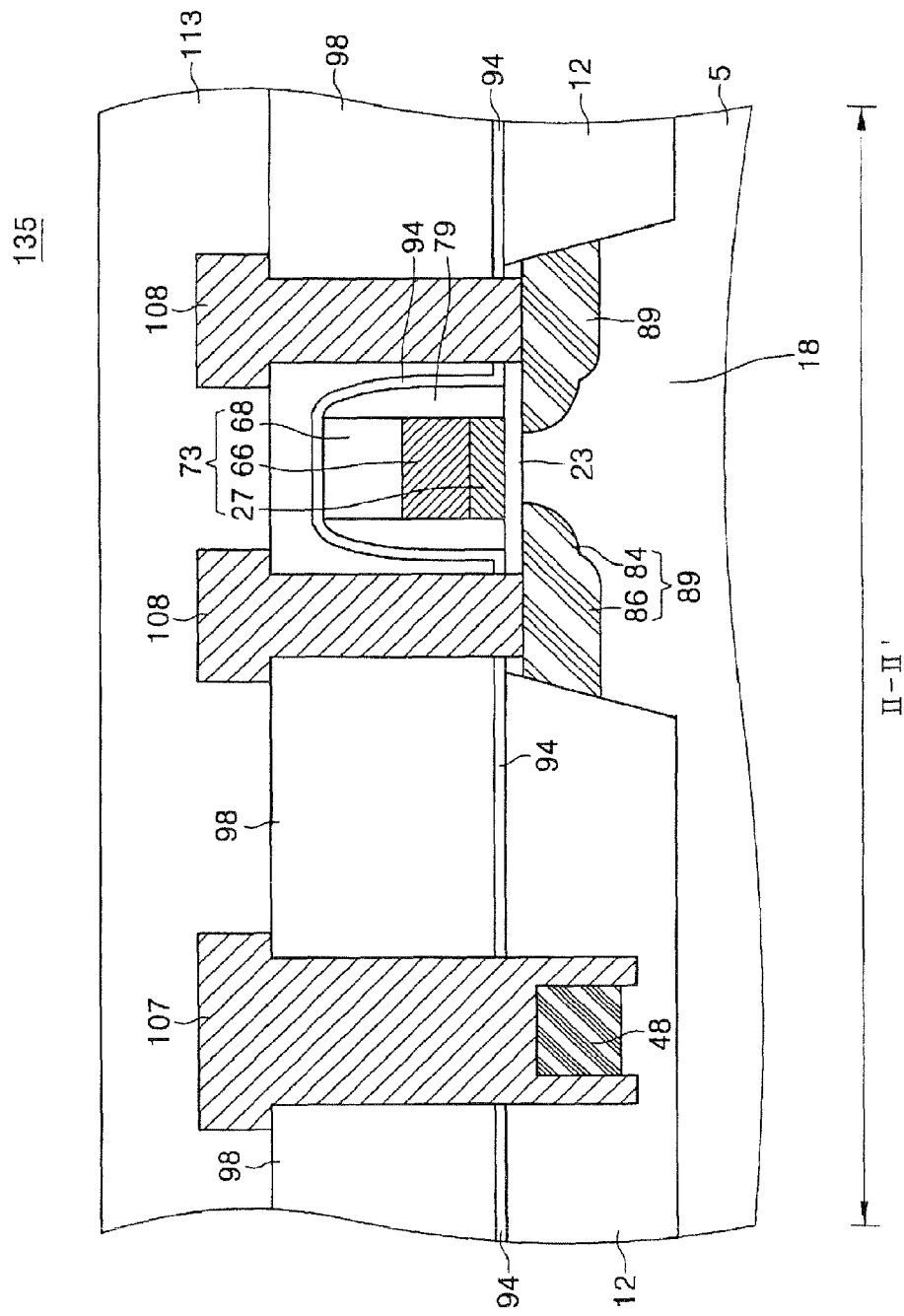
FIG. 2C is a cross-sectional view showing a semiconductor IC device taken along line II-II' of FIG. 1B according to some embodiments of the present invention.

FIGS. 1A and 1B are layout views showing a semiconductor integrated circuit (IC) device according to some embodiments of the present invention and FIG. 2A is a cross-sectional view showing a semiconductor IC device taken along line I-I' of FIG. 1A according to some embodiments of the present invention. FIG. 2B is a cross-sectional view showing a semiconductor IC device taken along line II-II' of FIG. 1A according to some embodiments of the present invention. FIG. 2C is a cross-sectional view showing a semiconductor IC device taken along line II-II' of FIG. 1B according to some embodiments of the present invention.

Referring to FIGS. 1A, 1B and 2A through 2C, a semiconductor IC device 135 according to some embodiments of the present invention includes a semiconductor substrate 5 (refer to FIGS. 2A through 2C) having a cell array region C (refer to FIGS. 1A and 1B) and a peripheral circuit region P (refer to FIGS. 1A and 1B). The semiconductor substrate 5 may include a conductive material having a pre-determined type of conductivity (i.e. n-type or p-type conductivity). The cell array region C may include patterns whose dimensions substantially approximate a design rule of the semiconductor IC device 135. The cell array region C may be divided into a cell central region A and a cell edge region B. The cell edge region B may surround the cell central region A and be surrounded by the peripheral circuit region P. The peripheral circuit region P may include patterns whose dimensions are larger than the design rule of the patterns disposed in the cell array region C.

A device isolation layer 12 is disposed in the cell central region A, the cell edge region B, and the peripheral circuit region P. The device isolation layer 12 may include one or more insulating layers. In one embodiment of the present invention, the device isolation layer 12 may define a cell active region 14 disposed in the cell central region A, a cell active region 16 disposed in the cell edge region B, and a peripheral active region 18 disposed in the peripheral circuit region P as shown in FIGS. 2A and 2B. The cell central region A of the semiconductor substrate 5 may include a plurality of cell active regions 14. The cell edge region B of the semiconductor substrate 5 may include a plurality of cell active regions 16. When a plurality of cell active regions 14 are disposed in the cell central region A and a plurality of cell active regions 16 are disposed in the cell edge region B, a selected cell active region 14 disposed in the cell central region A may form a pair with two selected cell active regions 16 disposed in the cell edge region B as shown in FIG. 1A. The peripheral active region 18 may or may not correspond to the selected cell active region 14 disposed in the cell central region A.

In another embodiment of the present invention, the device isolation layer 12 may define a cell active region 14 disposed in the cell central region A and a peripheral active region 18 disposed in the peripheral circuit region P as shown in FIGS. 2A and 2C. In this case, the device isolation layer 12 does not define the two selected cell active regions 16 in the cell edge region B, as shown in FIG. 1B. The device isolation layer 12 in the cell central region A of the semiconductor substrate 5 may include a plurality of cell active regions 14. When the plurality of cell active regions 14 are disposed in the cell central region A, the peripheral active region 18 may or may not correspond to a selected cell active region 14 disposed in the cell central region A. Hereinafter, a selected cell active region disposed in the cell central region A will be referred to as the cell active region 14 of the cell central region A for brevity. Also, two selected cell active regions 16 disposed in the cell edge region B will be referred to as the cell active regions 16 of the cell edge region B.

Referring again to FIGS. 1A, 1B, and 2A through 2C, in one embodiment of the present invention, two cell gate patterns 59 (refer to FIGS. 1A, 2A, and 2B) are disposed on the device isolation layer 12 and the cell active regions 14 and 16. Each of the cell gate patterns 59 may include a cell gate 48 and a cell gate capping pattern 58 which are sequentially stacked. The cell gate 48 is disposed under top surfaces of the cell active regions 14 and 16 and the device isolation layer 12 and extend toward the semiconductor substrate 5. The cell gate 48 may be formed of a conductive layer. The cell gate capping pattern 58 may be disposed on the cell active regions 14 and 16 and the device isolation layer 12 and protrude from the cell active regions 14 and 16 and the device isolation layer 12. The cell gate capping pattern 58 may be formed of an insulating layer. The cell gate capping pattern 58 may have a predetermined radius of curvature R. Thus, the cell gate patterns 59 may be disposed on the device isolation layer 12 and the cell active regions 14 and 16 across the cell central region A and the cell edge region B. The cell gate patterns 59 may correspond to the cell active region 14 of the cell central region A and also, correspond to the respective cell active regions 16 of the cell edge region B.

In another embodiment of the present invention, two cell gate patterns 59 (refer to FIGS. 1B, 2A, and 2C) are disposed on the device isolation layer 12 and the cell active region 14 of the cell central region A. Each of the cell gate patterns 59 may include a cell gate 48 and a cell gate capping pattern 58 which are sequentially stacked. The cell gate 48 may be disposed under top surfaces of the cell active region 14 and the device isolation layer 12 and extend toward the semiconductor substrate 5. The cell gate capping pattern 58 may be disposed in the cell active region 14 and the device isolation layer 12 and protrude from the top surfaces of the cell active region 14 and the device isolation layer 12. The cell gate capping pattern 58 may have a predetermined radius of curvature R. Thus, the cell gate patterns 59 may be disposed on the cell active region 14 and the device isolation layer 12 across the cell central region A and the cell edge region B. The cell gate patterns 59 may correspond to the cell active region 14 of the cell central region A.

According to some embodiments of the present invention, a peripheral gate pattern 73 is disposed on the peripheral active region 18 as shown in FIGS. 1A, 1B, 2B, and 2C. The peripheral gate pattern 73 may include a peripheral gate lower pattern 27, a peripheral gate upper pattern 66, and a peripheral gate capping pattern 68 which are sequentially stacked. The peripheral gate capping pattern 68 may be formed of an insulating layer. Each of the peripheral gate upper pattern 66 and the peripheral gate lower pattern 27 may be formed of a conductive layer. The peripheral gate pattern 73 may be disposed in the peripheral circuit region P to cover the peripheral active region 18 and the device isolation layer 12. The peripheral gate pattern 73 may extend upward from a top surface of the peripheral active region 18.

Referring again to FIGS. 1A, 1B, and 2A through 2C, according to some embodiments of the present invention, first and second cell electrical nodes 104 and 130 (refer to FIGS. 1A, 1B, and 2A) are disposed on the cell active region 14 adjacent to the cell gate patterns 59 of the cell central region A. The first cell electrical node 104 may be an interconnection structure, which is interposed between the cell gate patterns 59 and contacts the cell active region 14. The second cell electrical nodes 130 may be storage structures, which are in contact with the cell active region 14 by interposing the interconnection structure (i.e., the first cell electrical node 104) therebetween. In another case, the first and second cell electrical nodes 104 and 130 may be an interconnection structure. The interconnection structure may be a bit line pattern or another circuit interconnection line. The interconnection structure may be a conductive layer. When the semiconductor IC device 135 is a dynamic random access memory (DRAM) device, the storage structure may include a node plug 119 and a capacitor 128 which are sequentially stacked. The capacitor 128 may include a lower electrode 122, a dielectric layer 124, and an upper electrode 126. Each of the upper electrode 126, the lower electrode 122, and the node plug 119 may be formed of a conductive layer. When the semiconductor IC device 135 is a phase-change random access memory (PRAM) device, the storage structure may be formed of a phase-change material. Also, when the semiconductor IC device 135 is a ferroelectric random access memory (FRAM) device, the storage structure may be formed of a ferroelectric material.

According to some embodiments of the present invention, peripheral electrical nodes 108 are disposed on the peripheral active region 18 adjacent to the peripheral gate patterns 73 as shown in FIGS. 1A, 1B, 2B, and 2C. The peripheral electrical nodes 108 may be an interconnection structure. The interconnection structure may be a conductive layer. In one embodiment of the present invention, connection lines 106 are in contact with the cell gate patterns 59 and the cell active region 16 of the cell edge region B as shown in FIGS. 1A and 2B. The connection lines 106 may be formed of a conductive layer. Each of the connection lines 106 may contact the cell gate 48 across the cell gate capping pattern 58. The respective connection lines 106 may be disposed on the cell gate 48 so as to have different widths at different portions thereof. In another embodiment of the present invention, connection lines 107 are in contact with the cell gate patterns 59 and the device isolation layer 12 of the cell edge region B as shown in FIGS. 1B and 2C. Each of the connection lines 107 may contact the cell gate 48 across the cell gate capping pattern 58. The connection lines 107 may be disposed on the cell gate 48 so as to have the same width. Also, the connection lines 107 may substantially surround the cell gate 48 and extend from the cell gate 48 toward the semiconductor substrate 12.

Referring again to FIGS. 1A, 1B, and 2A through 2C, in one embodiment of the present invention, cell impurity diffusion regions 82 are disposed on the cell active region 14 of the cell central region A and the cell active regions 16 of the cell edge region B and overlap the cell gate patterns 59 as shown in FIGS. 2A and 2B. The cell impurity diffusion regions 82 disposed in the cell central region A may contact the first and second cell electrical nodes 104 and 130 through the cell active region 14. The cell impurity diffusion regions 82 disposed in the cell edge region B may respectively contact the connection lines 106 through the cell active regions 16. In another embodiment of the present invention, cell impurity diffusion regions 82 are disposed on the cell active region 14 of the cell central region A and overlap the cell gate patterns 59 as shown in FIGS. 2A and 2C. The cell impurity diffusion regions 82 may be of an opposite conductivity to the semiconductor substrate 5. The cell impurity diffusion regions 82 of the cell central region A may respectively contact the first and second cell electrical nodes 104 and 130 through the cell active region 14. According to some embodiments of the present invention, peripheral impurity diffusion regions 89 are disposed on the peripheral active region 18 and overlap the peripheral gate pattern 73 as shown in FIGS. 2B and 2C. The peripheral impurity diffusion regions 89 may be lightly doped drain (LDD) regions, which include peripheral lightly doped regions 84 and peripheral heavily doped regions 86. The peripheral impurity diffusion regions 89 may include either or both of the peripheral lightly doped regions 84 and the peripheral heavily doped regions 86. The peripheral impurity diffusion regions 89 may respectively contact the peripheral electrical nodes 108 through the peripheral active region 18.

According to some embodiments of the present invention, an etch stop layer 94, a buried interlayer insulating layer 98, and a planarized interlayer insulating layer 113 may be sequentially stacked on the semiconductor substrate 5 to cover the cell central region A, the cell edge region B, and the peripheral circuit region P as shown in FIGS. 2A through 2C. Each of the etch stop layer 94, the buried interlayer insulating layer 98, and the planarized interlayer insulating layer 113 may be an insulating layer. The planarized interlayer insulating layer 113, the buried interlayer insulating layer 98, and the etch stop layer 94 may cover the first cell electrical node 104, the connection lines 106 and/or 107, and the peripheral electrical nodes 108 and substantially surround the second cell electrical node 130. A pad upper layer 23 may be disposed on the cell active regions 14 and/or 16 and the peripheral active region 18 to substantially surround the first and second cell electrical nodes 104 and 130 and the peripheral electrical nodes 108 as shown in FIGS. 2A through 2C. Pad lower layers 38 may contact the pad upper layer 23 and substantially surround the cell gate patterns 59, respectively. The pad lower layers 38 and the pad upper layer 23 may be insulating layers.

Hereinafter, methods of fabricating semiconductor IC devices including gate patterns having a step difference therebetween and a connection line interposed between the gate patterns will be described with reference to the remaining drawings.

FIGS. 3A through 10A are cross-sectional views illustrating a method of fabricating a semiconductor IC device taken along line I-I' of FIG. 1A according to some embodiments of the present invention and FIGS. 3B through 10B are cross-sectional views illustrating a method of fabricating a semiconductor IC device taken along line II-II' of FIG. 1A according to some embodiments of the present invention. FIGS. 3C through 10C are cross-sectional views illustrating a method of fabricating a semiconductor IC device taken along line II-II' of FIG. 1B according to some embodiments of the present invention.

Figure 3A:
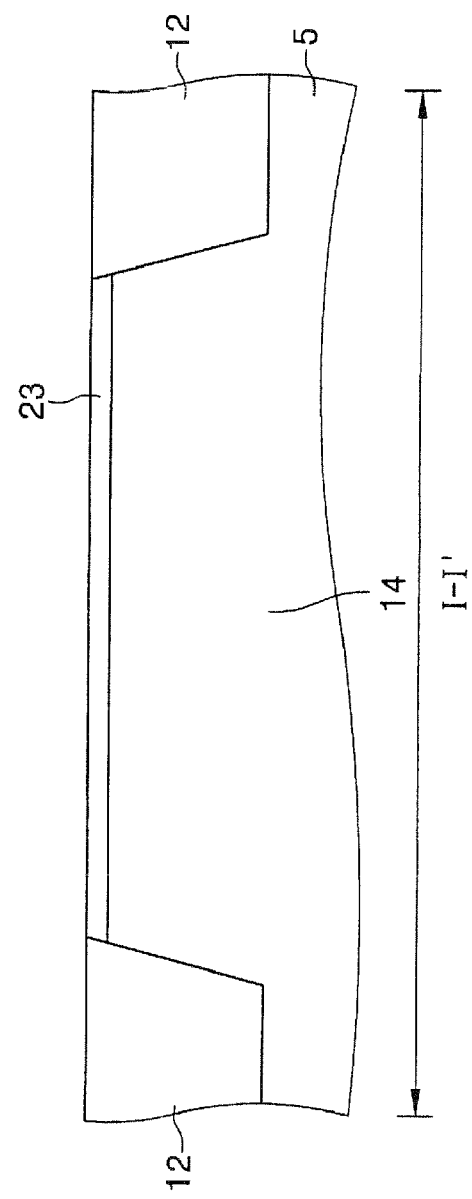
Figure 3B:
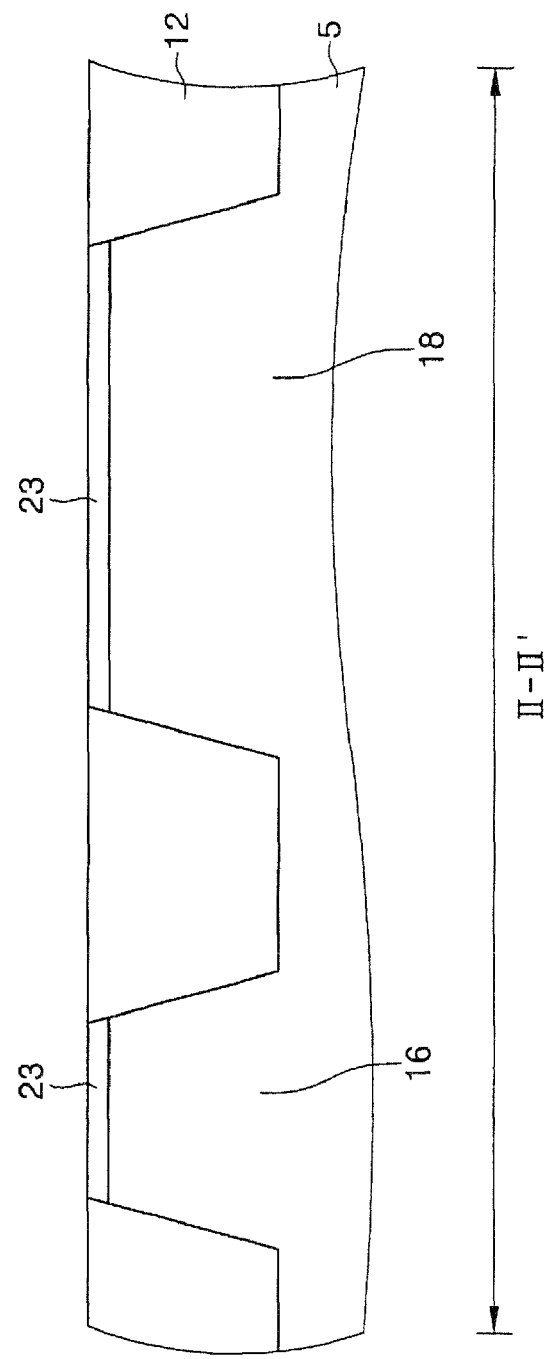
Figure 3C:
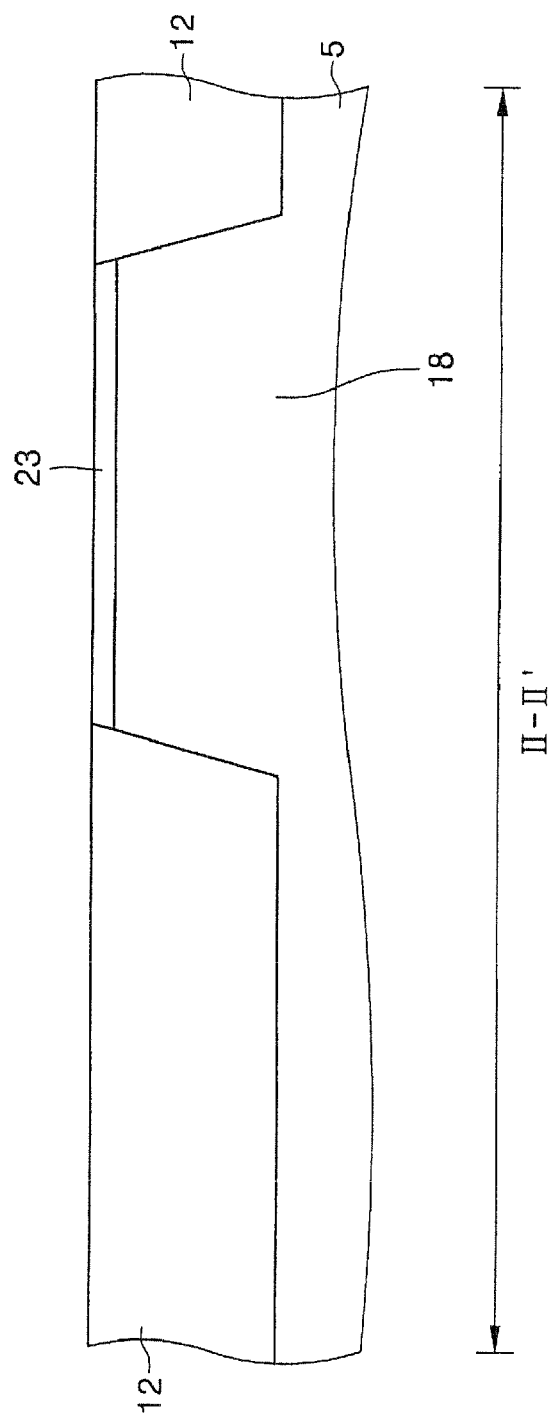

Referring to FIGS. 1A, 1B, and 3A through 3C, according to some embodiments of the present invention, a semiconductor substrate 5 having a cell central region A, a cell edge region B, and a peripheral circuit region P is prepared. The semiconductor substrate 5 may include a conductive material having a pre-determined type of conductivity (i.e. n-type or p-type conductivity). The peripheral circuit region P may be formed to surround the cell edge region B. The cell edge region B may be formed to surround the cell central region A. The cell central region A and the cell edge region B constitute a cell array region C. A device isolation layer 12 is formed in the semiconductor substrate 5 as shown in FIGS. 3A through 3C. The device isolation layer 12 may be formed of an insulating material containing metal atoms and/or nonmetal atoms interposed in a silicon lattice. The device isolation layer 12 may include one or more insulating layers. The device isolation layer 12 may be formed to define a cell active region 14 in the cell central region A and to define a peripheral active region 18 in the peripheral circuit region P.

In one embodiment of the present invention, the device isolation layer 12 may be formed to define not only the cell active region 14 of the cell central region A and the peripheral active region 18 of the peripheral circuit region P but also cell active regions 16 of the cell edge region B as shown in FIGS. 1A, 3A, and 3B. Also, a pad upper layer 23 is formed on the cell active regions 14 and 16 and the peripheral active region 18. In another embodiment of the present invention, the device isolation layer 12 defines the cell active region 14 of the cell central region A and the peripheral active region 18 of the peripheral circuit region P, but it does not define the cell active regions 16 in the cell edge region B as shown in FIGS. 1B, 3A, and 3C. Thus, the device isolation layer 12 may be formed throughout the cell edge region B. Also, a pad upper layer 23 is formed on the cell active region 14 and the peripheral active region 18. According to some embodiments of the present invention, the pad upper layer 23 may be formed of an insulating material containing metal atoms and/or nonmetal atoms interposed in a silicon lattice.

Figure 4A:
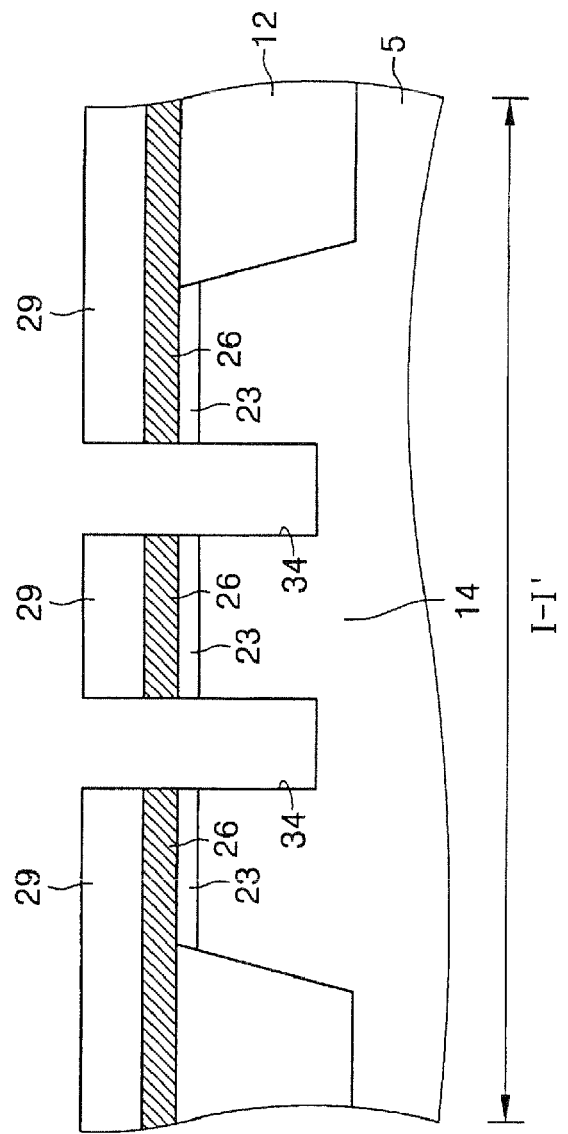
Figure 4B:
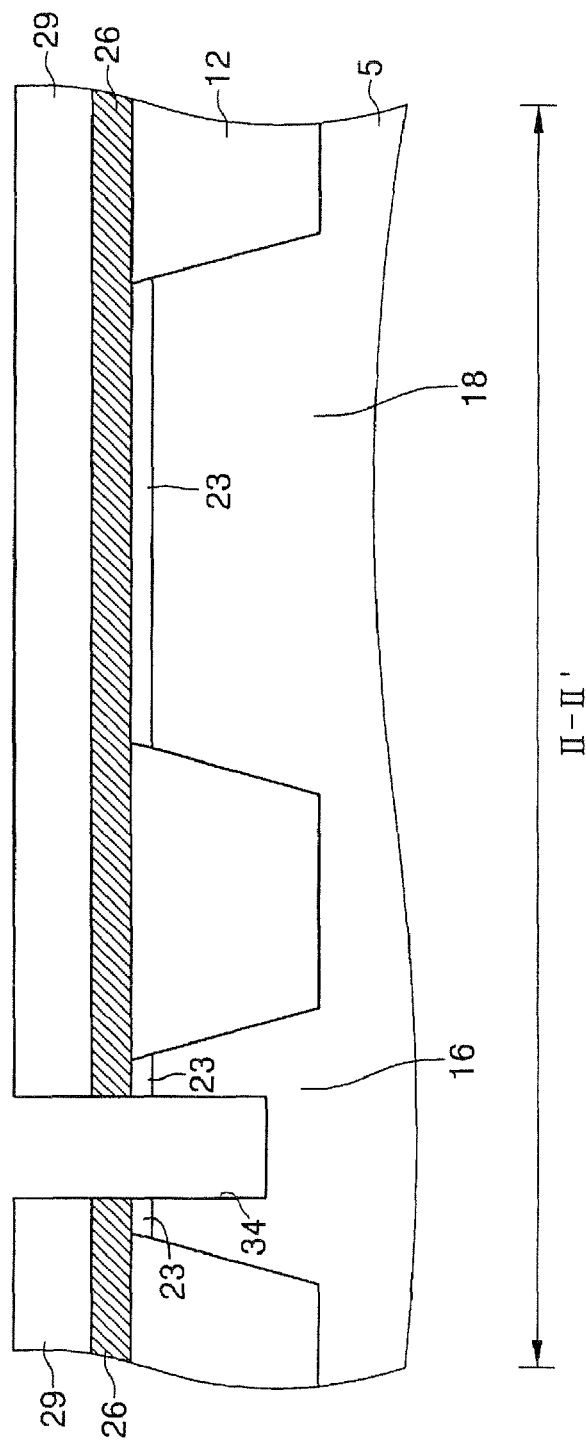

Referring to FIGS. 1A, 1B, and 4A through 4C, according to some embodiments of the present invention, a peripheral gate lower layer 26 and a sacrificial layer 29 are sequentially formed on the pad upper layer 23 as shown in FIGS. 4A through 4C. The sacrificial layer 29 may be formed of an insulating material. The sacrificial layer 29 may be a silicon nitride layer. The peripheral gate lower layer 26 may be formed of a conductive material. The peripheral gate lower layer 26 may be a doped polysilicon layer. A photoresist layer (not shown) is formed on the sacrificial layer 29. The photoresist layer may be obtained using a semiconductor photolithography process as is known to those of ordinary skill in the art. In one embodiment of the present invention, the photoresist layer may be formed to have openings, which overlap the respective cell active regions 14 and 16 of the cell central region A and the cell edge region B and expose the sacrificial layer 29. The cell active regions 14 and 16 of the cell central region A and the cell edge region B are partially etched using the photoresist layer as an etch mask to sequentially penetrate the sacrificial layer 29 and the peripheral gate lower layer 26 so that channel trenches 34 are formed as shown in FIGS. 4A and 4B.

In another embodiment of the present invention, the photoresist layer may be formed to have openings, which overlap the respective cell active region 14 of the cell central region A and the device isolation layer 12 of the cell edge region B and expose the sacrificial layer 29. The cell active region 14 of the cell central region A and the device isolation layer 12 of the cell edge region B are partially etched using the photoresist layer as an etch mask to sequentially penetrate the sacrificial layer 29 and the peripheral gate lower layer 26 so that channel trenches 34 are formed as shown in FIGS. 4A and 4C.

In some embodiments of the present invention, after forming the channel trenches 34, the photoresist layer is removed from the semiconductor substrate 5.

Referring to FIGS. 1A, 1B, and 5A through 5C, in one embodiment of the present invention, pad lower layers 38 are respectively formed in the channel trenches 34 formed in the cell central region A and the cell edge region B. The pad lower layers 38 may be formed to conformally cover the channel trenches 34 formed in the cell central region A and the cell edge region B and contact the pad upper layers 23. A cell gate layer 44 is formed on the sacrificial layer 29 to fill the channel trenches 34 formed in the cell central region A and the cell edge region B.

Figure 5A:
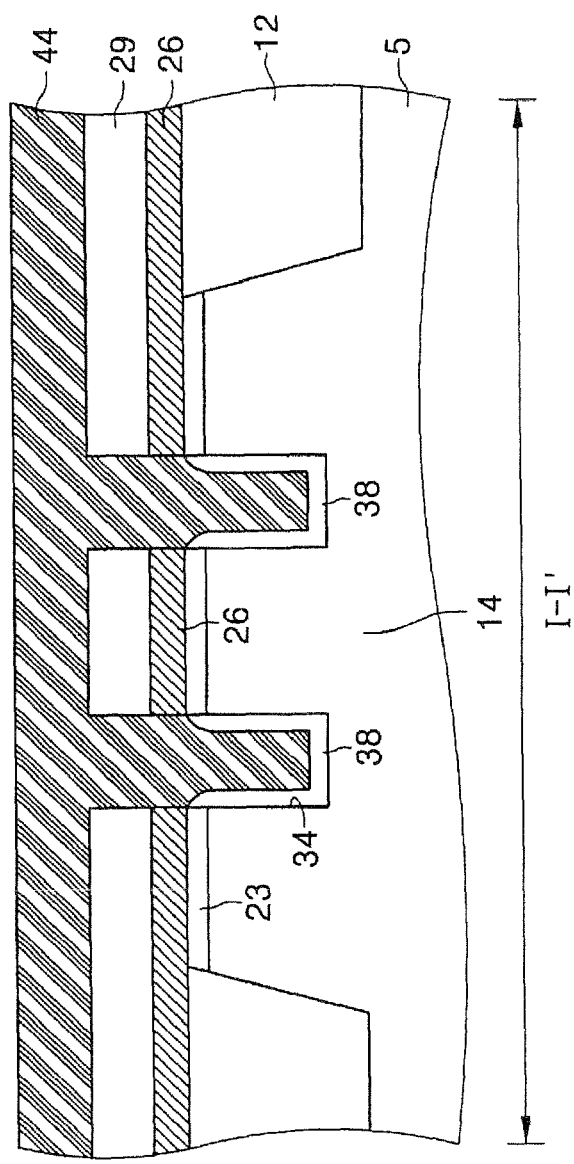
Figure 5B:
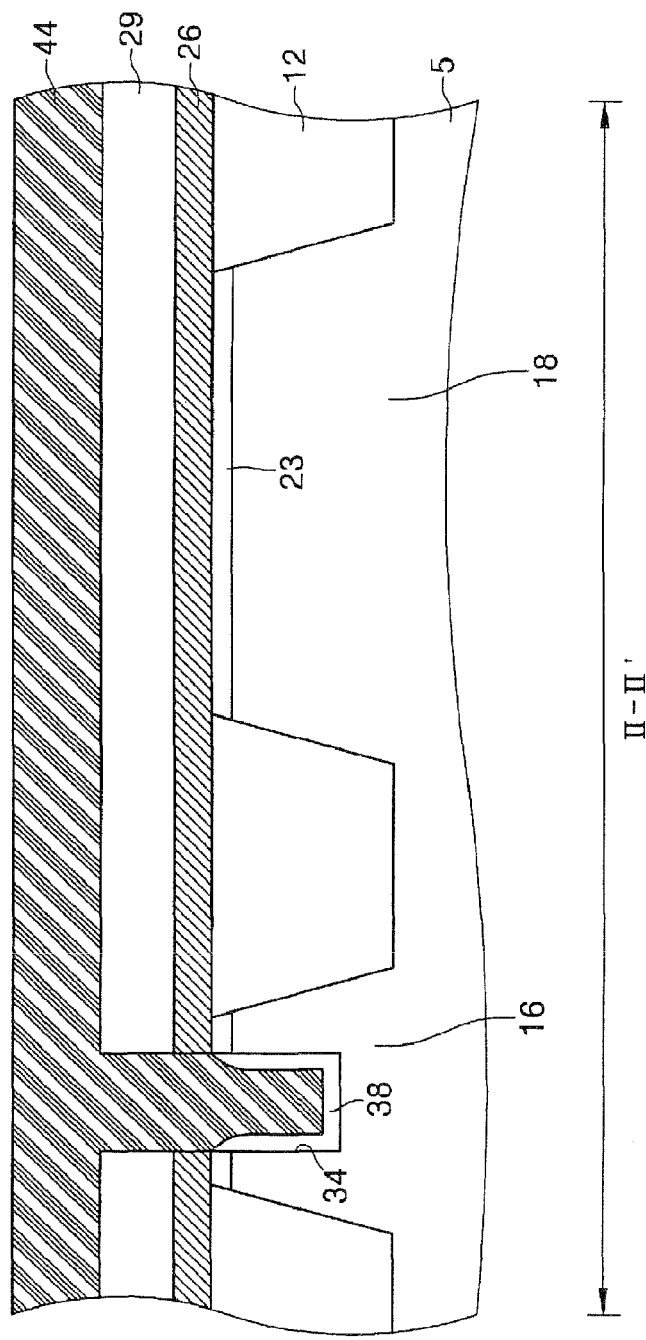

In another embodiment of the present invention, pad lower layers 38 are respectively formed in the channel trenches 34 formed in the cell central region A and the cell edge region B as shown in FIGS. 5A and 5C. The pad lower layers 38 may be formed to conformally cover the channel trenches 34 formed in the cell central region A and contact the pad upper layers 23. A cell gate layer 44 is formed on the sacrificial layer 29 to fill the channel trenches 34 formed in the cell central region A and the cell edge region B. According to some embodiments of the present invention, the pad lower layers 38 may be formed of an insulating material containing metal atoms and/or nonmetal atoms interposed in a silicon lattice. The cell gate layer 44 may be formed of conductive material. The cell gate layer 44 may be a metal layer or a doped polysilicon layer.

Figure 6A:
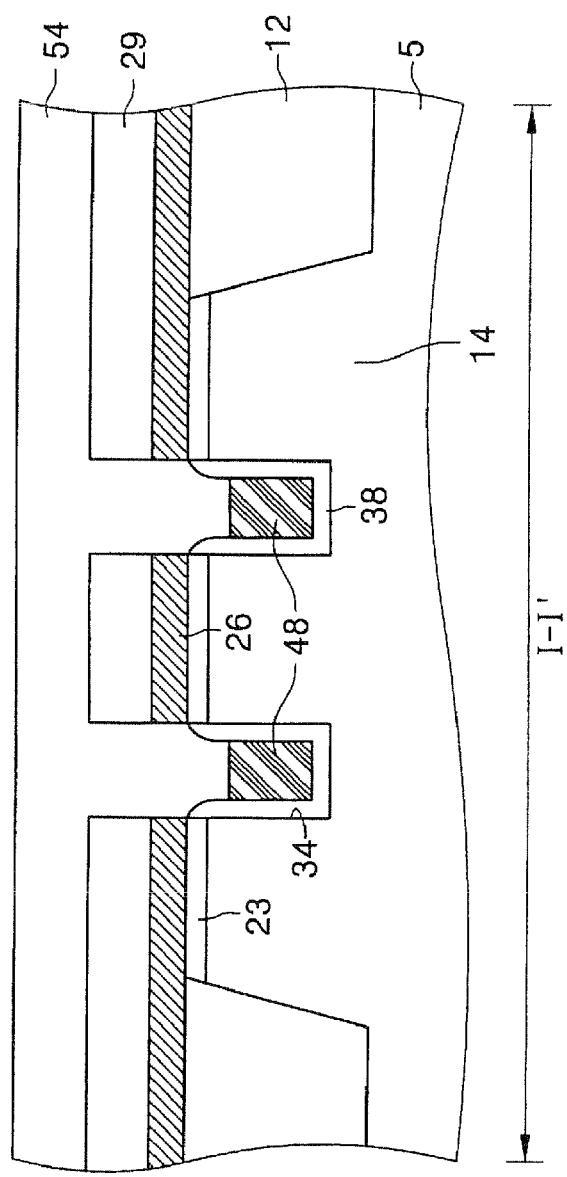
Figure 6B:
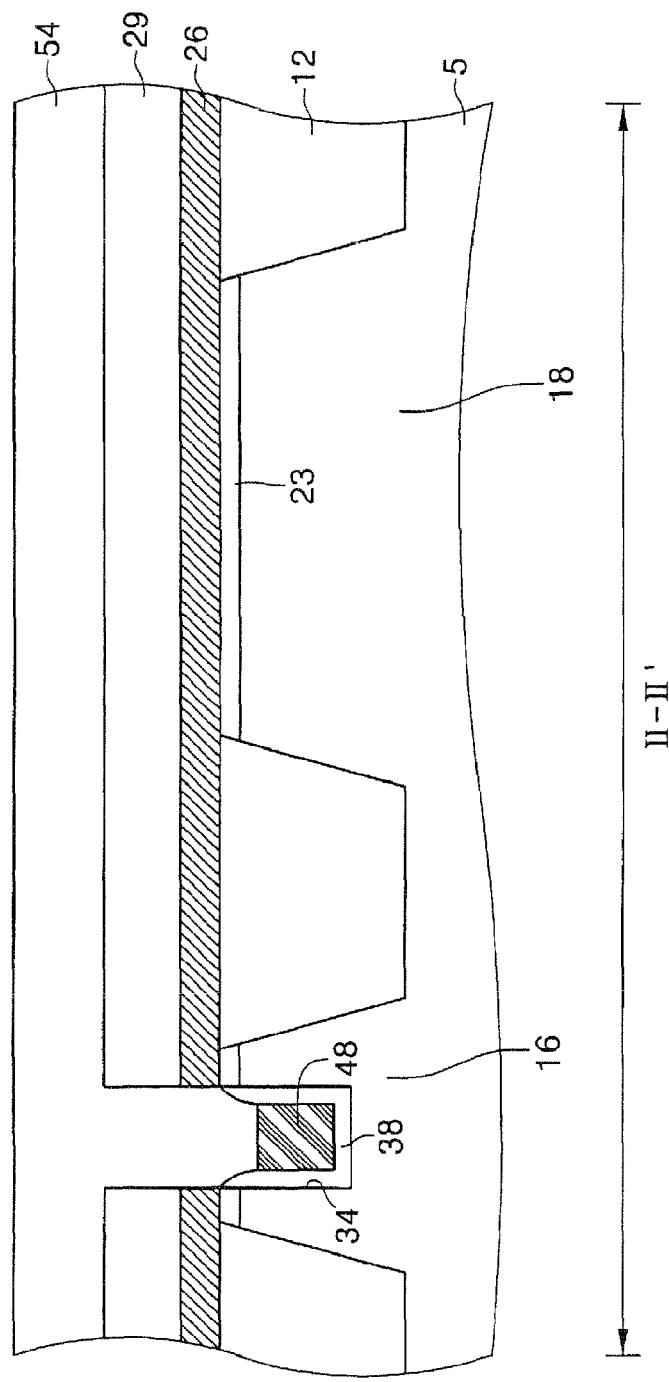

Referring to FIGS. 1A, 1B, and 6A through 6C, in one embodiment of the present invention, the cell gate layer 44 is partially etched to expose the sacrificial layer 29, the peripheral gate lower layer 26, and the pad lower layer 38 so that cell gates 48 are respectively formed in the channel trenches 34 formed in the cell central region A and the cell edge region B as shown in FIGS. 6A and 6B. The cell gates 48 may be formed under top surfaces of the device isolation layer 12 and the cell active regions 14 and 16 formed in the cell central region A and the cell edge region B. A cell gate capping layer 54 is formed on the sacrificial layer 29 to cover the cell gates 48 and fill the channel trenches 34 formed in the cell central region A and the cell edge region B.

Figure 6C:
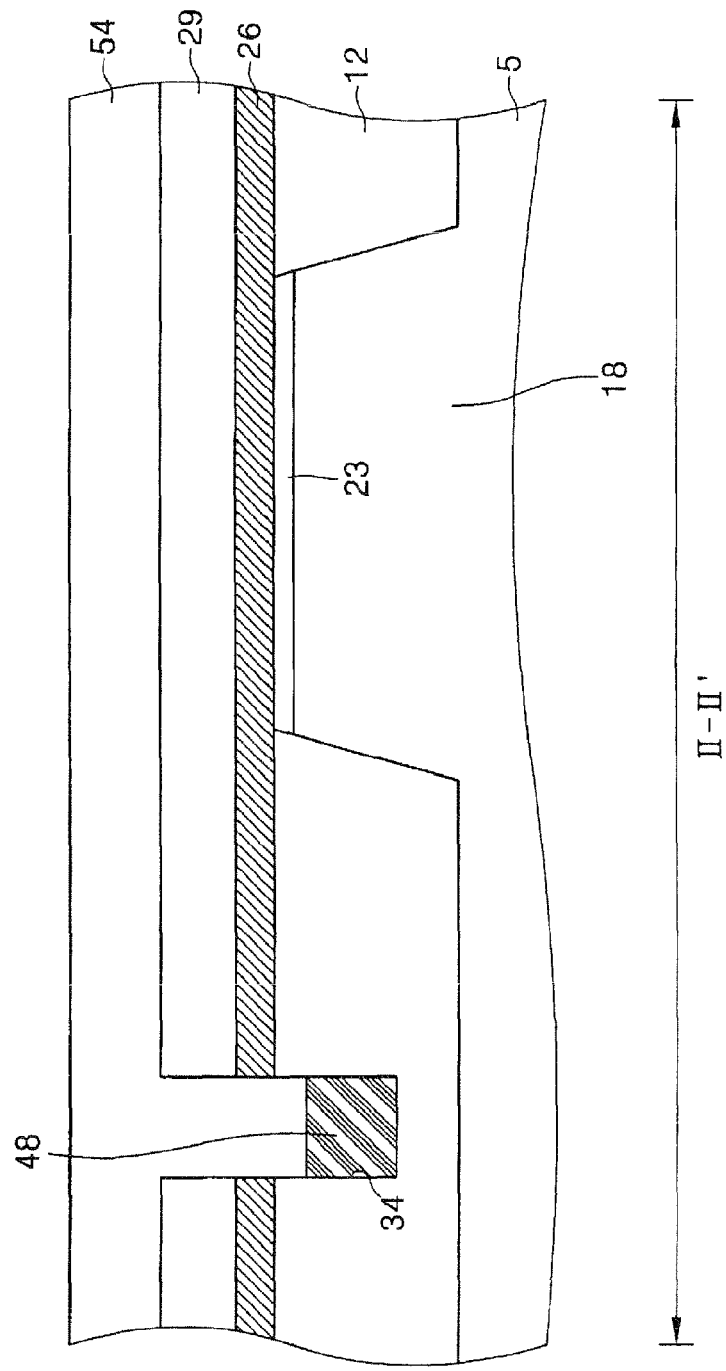

In another embodiment of the present invention, the cell gate layer 44 is partially etched to expose the sacrificial layer 29, the peripheral gate lower layer 26, and the pad lower layer 38 so that cell gates 48 are respectively formed in the channel trenches 34 formed in the cell central region A and the cell edge region B as shown in FIGS. 6A and 6C. The cell gates 48 may be formed under a top surface of the cell active region 14 formed in the cell central region A and a top surface of the device isolation layer 12 formed in the cell edge region B. A cell gate capping layer 54 is formed on the sacrificial layer 29 to cover the cell gates 48 and fill the channel trenches 34 formed in the cell central region A and the cell edge region B.

According to some embodiments of the present invention, the cell gate capping layer 54 may be formed of an insulating material. The cell gate capping layer 54 may be a silicon nitride layer.

Figure 7A:
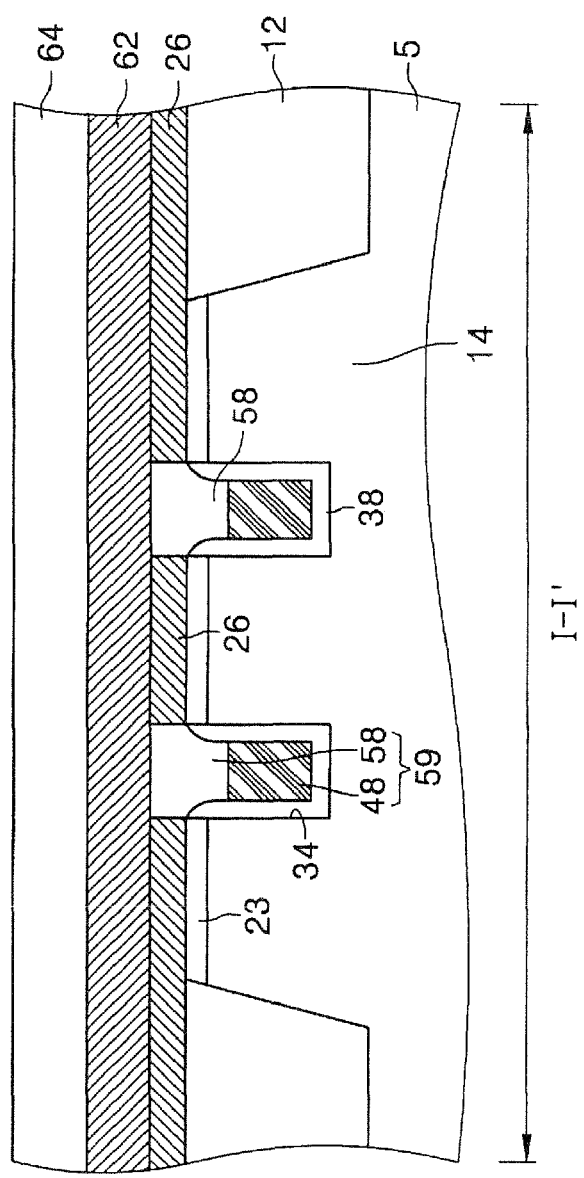

Referring to FIGS. 1A, 1B, and 7A through 7C, in one embodiment of the present invention, the cell gate capping layer 54 and the sacrificial layer 29 are sequentially etched to expose the peripheral gate lower layer 26 so that cell gate capping patterns 58 are respectively formed in the channel trenches 34 formed in the cell central region A and the cell edge region B as shown in FIGS. 7A and 7B. The cell gate capping patterns 58 may respectively contact the cell gates 48, fill the channel trenches 34 formed in the cell central region A and the cell edge region B, and protrude from the device isolation layer 12 and the cell active regions 14 and 16. Top surfaces of the cell gate capping patterns 58 may be at substantially the same level as a top surface of the peripheral gate lower layer 26. The cell gate capping patterns 58, along with the cell gates 48, constitute cell gate patterns 59. Thus, the cell gate patterns 59 may cross over the cell active region 14, the cell active regions 16, and the device isolation layer 12 of the cell central region A and the cell edge region B and protrude from the cell active regions 14 and 16 and the device isolation layer 12.

In another embodiment of the present invention, the cell gate capping layer 54 and the sacrificial layer 29 are sequentially etched to expose the peripheral gate lower layer 26 so that cell gate capping patterns 58 are respectively formed in the channel trenches 34 formed in the cell central region A and the cell edge region B as shown in FIGS. 7A and 7C. The cell gate capping patterns 58 may respectively contact the cell gates 48, fill the channel trenches 34 formed in the cell central region A and the cell edge region B, and protrude from the cell active region 14 and the device isolation layer 12. Top surfaces of the cell gate capping patterns 58 may be at substantially the same level as a top surface of the peripheral gate lower layer 26. The cell gate capping patterns 58, along with the cell gates 48, constitute cell gate patterns 59. Thus, the cell gate patterns 59 may cross over the cell active region 14 and the device isolation layer 12 of the cell central region A and the cell edge region B and protrude from the cell active region 14 and the device isolation layer 12.

According to some embodiments of the present invention, a peripheral gate upper layer 62 and a peripheral gate capping layer 64 are sequentially formed on the peripheral gate lower layer 26 as shown in FIGS. 1A, 1B, and 7A through 7C. The peripheral gate capping layer 64 may be formed of an insulating material. The peripheral gate capping layer 64 may be a silicon nitride layer. The peripheral gate upper layer 62 may be formed of a conductive material. The peripheral gate upper layer 62 may be a metal silicide layer.

Figure 8B:
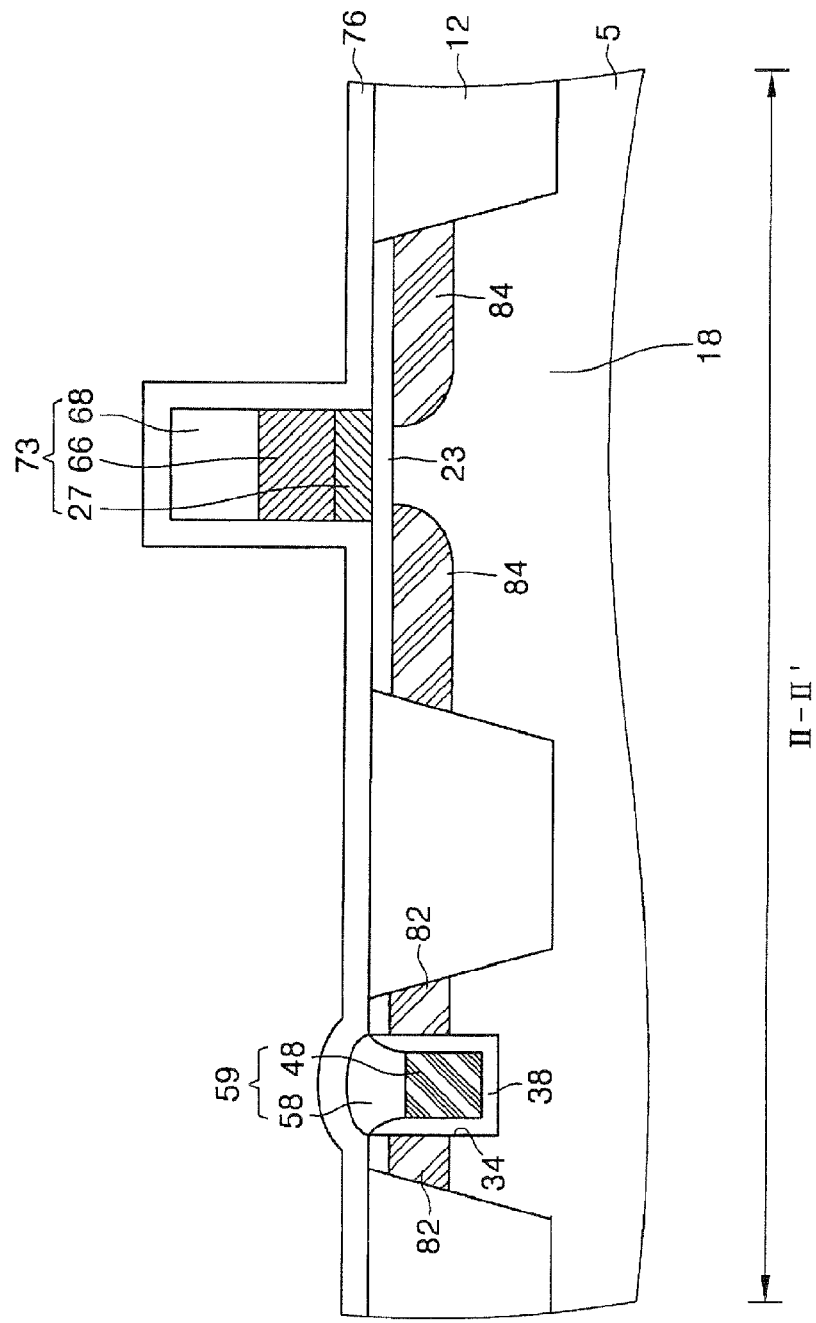
Figure 8C:
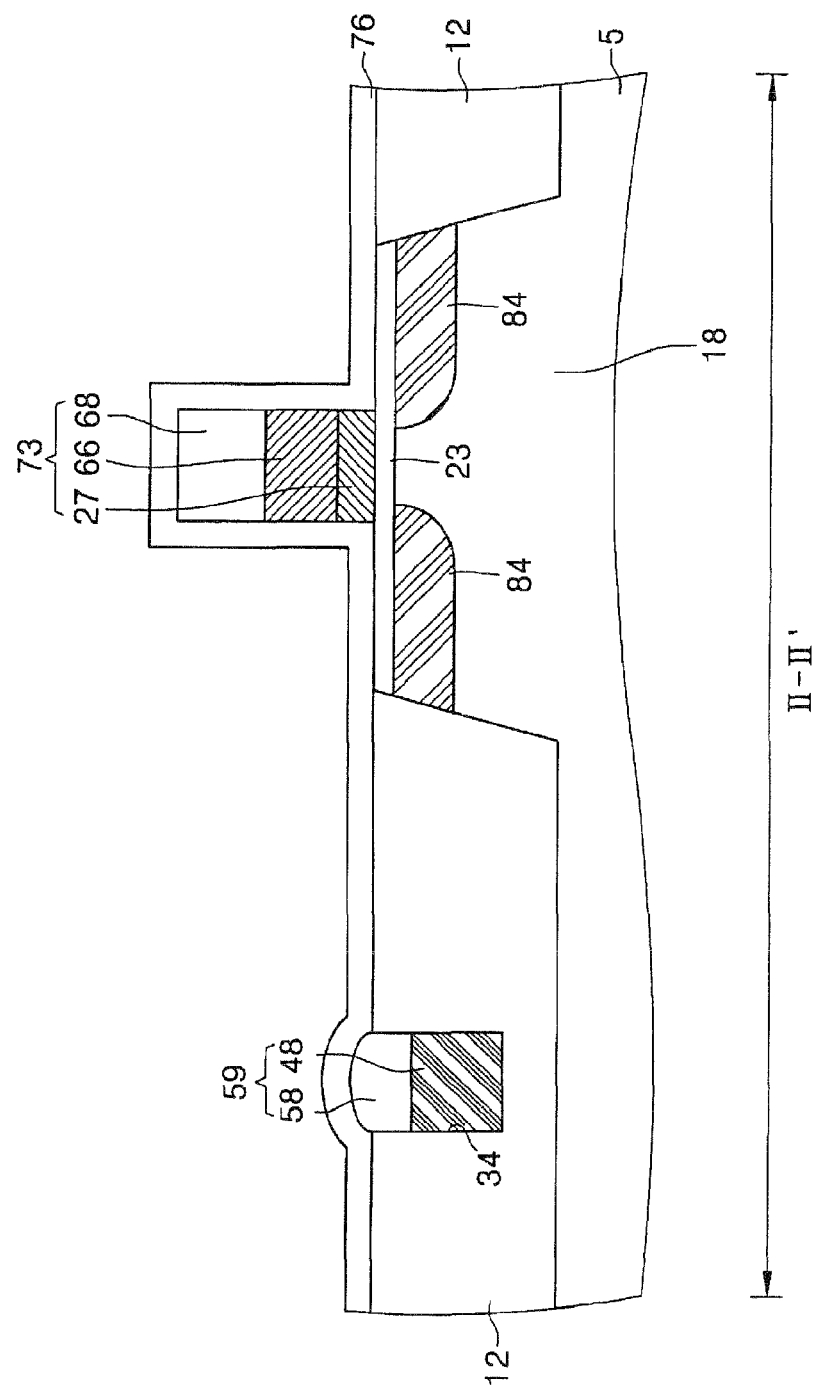

Referring to FIGS. 1A, 1B, and 8A through 8C, according to some embodiments of the present invention, a photoresist pattern (not shown) is formed on the peripheral gate capping layer 64. The photoresist pattern may be formed using a semiconductor photolithography process as is known to those of ordinary skill in the art. The photoresist pattern may be formed to correspond to the peripheral active region 18 and expose the peripheral gate capping layer 64. In one embodiment of the present invention, the peripheral gate capping layer 64, the peripheral gate upper layer 62, and the peripheral gate lower layer 26 are sequentially etched using the photoresist pattern as an etch mask and using the device isolation layer 12, the pad upper layer 23 and the cell gate capping patterns 58 as an etch buffer layer so that a peripheral gate pattern 73 is formed as shown in FIGS. 1A, 8A, and 8B. In another embodiment of the present invention, the peripheral gate capping layer 64, the peripheral gate upper layer 62, and the peripheral gate lower layer 26 are sequentially etched using the photoresist pattern as an etch mask and using the device isolation layer 12, the pad upper layer 23 and the cell gate capping patterns 58 as an etch buffer layer so that a peripheral gate pattern 73 is formed as shown in FIGS. 1B, 8A, and 8C.

According to some embodiments of the present invention, after forming the peripheral gate pattern 73, the photoresist pattern is removed from the semiconductor substrate 5. The gate capping patterns 58 may be formed to have a predetermined radius of curvature R as shown in FIGS. 8A through 8C. This is because the gate capping patterns 58 sustain etch damage during the formation of the peripheral gate pattern 73. The peripheral gate pattern 73 may be formed to have a peripheral gate lower pattern 27, a peripheral gate upper pattern 66, and a peripheral gate capping pattern 68 which are sequentially stacked. The peripheral gate pattern 73 may be formed on the peripheral active region 18 and extend upward from a top surface of the peripheral active region 18. In one embodiment of the present invention, cell impurity diffusion regions 82 are formed in the cell active region 14 of the cell central region A and the cell active regions 16 of the cell edge region B using the cell gate patterns 59 as a mask. Also, peripheral lightly doped regions 84 are formed in the peripheral active region 18 of the peripheral circuit region P using the peripheral gate pattern 73 as a mask. The peripheral lightly doped regions 84 may overlap the peripheral gate patterns 73. The cell impurity diffusion regions 82 may overlap the cell gate patterns 59 formed in the cell central region A and the cell edge region B.

In another embodiment of the present invention, cell impurity diffusion regions 82 are formed in the cell active region 14 of the cell central region A using the cell gate patterns 59 as a mask. Also, peripheral lightly doped regions 84 are formed in the peripheral active region 18 of the peripheral circuit region P using the peripheral gate pattern 73 as a mask. The peripheral lightly doped regions 84 may overlap the peripheral gate patterns 73. The cell impurity diffusion regions 82 may overlap the cell gate patterns 59 formed in the cell central region A. According to some embodiments of the present invention, the peripheral lightly doped regions 84 may be formed to have the same type of conductivity as the semiconductor substrate 5 or an opposite type of conductivity to the semiconductor substrate 5. The cell impurity diffusion regions 82 may be formed to have an opposite type of conductivity to the semiconductor substrate 5. Subsequently, a spacer layer 76 is formed on the semiconductor substrate 5 to cover the peripheral gate pattern 73 and the cell gate pattern 59. The spacer layer 76 may be formed of an insulating material. The spacer layer 76 may be a silicon nitride layer.

Figure 9A:
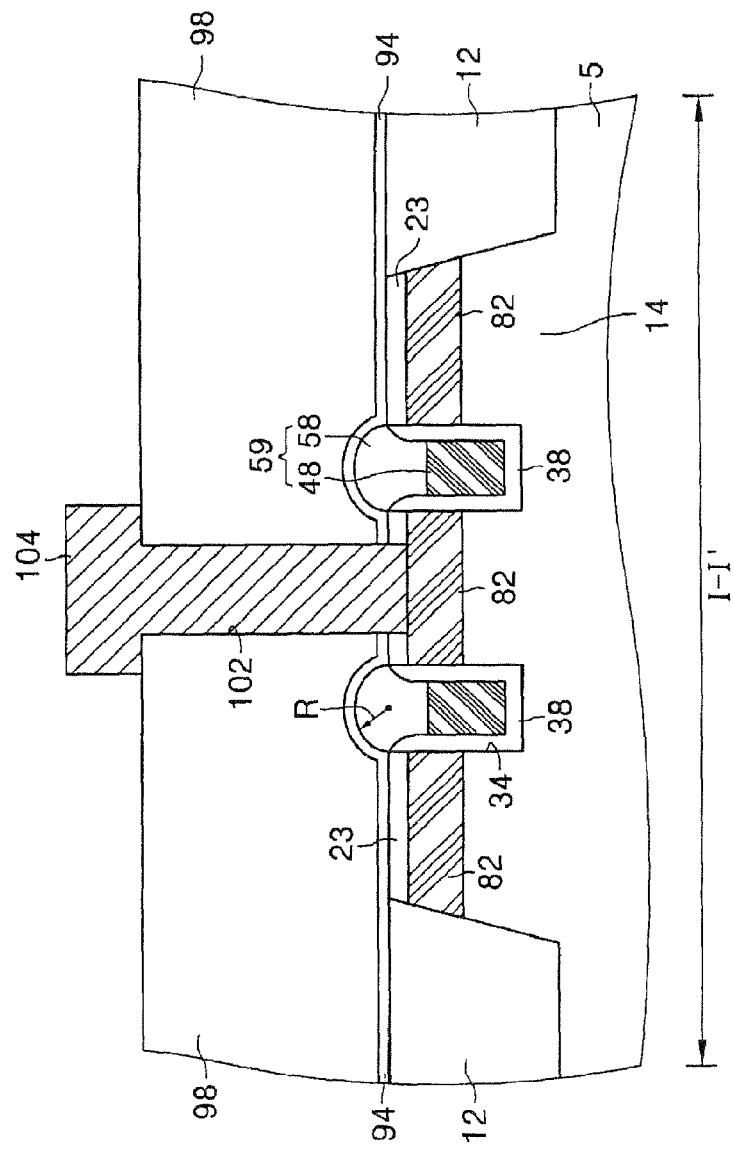
Figure 9B:
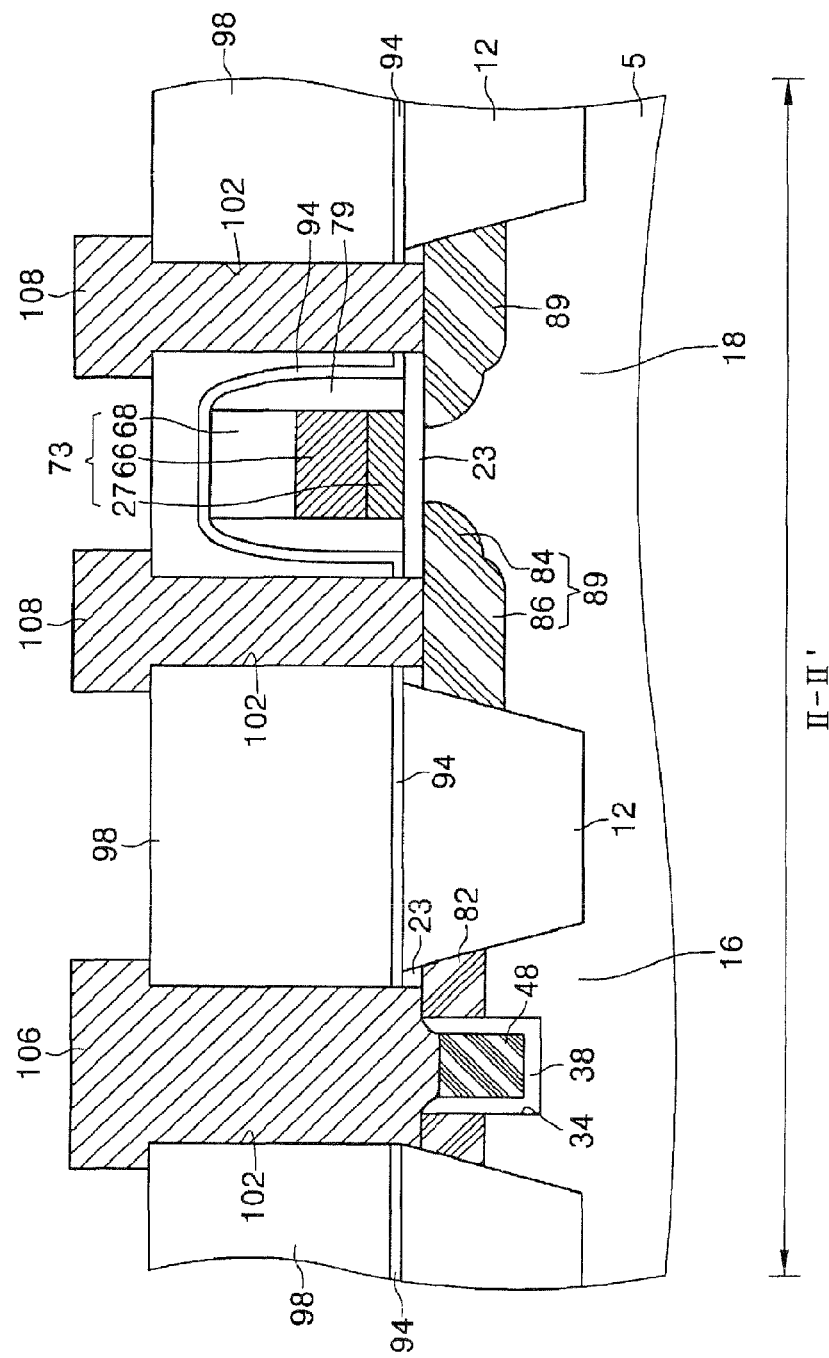

Referring to FIGS. 1A, 1B, and 9A through 9C, according to some embodiments of the present invention, the spacer layer 76 is etched using an etchback process so that peripheral gate spacers 79 are formed on sidewalls of the peripheral gate pattern 73 as shown in FIGS. 9A through 9C. After forming the peripheral gate spacers 79, a residue of the spacer layer 76 does not remain adjacent to the cell gate pattern 59 in the cell central region A and the cell edge region B. This is due to the fact that the cell gate patterns 59 include the cell gate capping patterns 58 having the predetermined radius of curvature R. Therefore, in some embodiments of the present invention, the cell gate capping patterns 58 enable subsequent semiconductor fabrication processes to be performed under stable process circumstances. Thereafter, peripheral heavily doped regions 86 are formed in the peripheral active region 18 using the peripheral gate pattern 73 and the peripheral gate spacers 79 as masks. The peripheral heavily doped regions 86 overlap the peripheral lightly doped regions 84 to constitute LDD-type peripheral impurity diffusion regions 89. The peripheral impurity diffusion regions 89 may be formed to have either or both of the peripheral lightly doped regions 84 and the peripheral heavily doped regions 86.

According to some embodiments of the present invention, an etch stop layer 94 and a buried interlayer insulating layer 98 are sequentially formed to cover the cell gate patterns 59 and the peripheral gate pattern 73. The etch stop layer 94 may be formed of an insulating material. The etch stop layer 94 may be a silicon nitride layer. The buried interlayer insulating layer 98 may be formed of an insulating material containing metal atoms and/or nonmetal atoms interposed in a silicon lattice. The buried interlayer insulating layer 98 may include one or more insulating layers. In one embodiment of the present invention, a photoresist layer (not shown) is formed on the buried interlayer insulating layer 98. The photoresist layer may be formed using a semiconductor photolithography process as is known to those of ordinary skill in the art. The photoresist layer may be formed to have openings, which overlap the cell active region 14 of the cell central region A, the gate patterns 59 of the cell edge region B, and the peripheral active region 18 of the peripheral circuit region P and expose the buried interlayer insulating layer 98.

Referring again to FIGS. 1A, 1B, and 9A through 9C, in one embodiment of the present invention, the buried interlayer insulating layer 98, the etch stop layer 94, the cell gate capping pattern 58, and the pad upper layer 23 are etched using the photoresist layer as an etch mask and using the cell active regions 14 and 16, the peripheral active region 18, and the cell gate patterns 59 as an etch buffer layer so that first connection holes 102 are formed as shown in FIGS. 9A and 9B. The first connection holes 102 may be formed to expose the cell active regions 14 and 16, the peripheral active region 18, and the cell gate patterns 59 of the cell edge region B. More specifically, one of the first connection holes 102 may be formed in the cell edge region B to expose the cell gate patterns 59 and the cell active regions 16 disposed adjacent to the cell gate patterns 59. After forming the first connection holes 102, the photoresist layer is removed from the semiconductor substrate 5. A conductive layer (not shown) is formed on the buried interlayer insulating layer 98 to fill the first connection holes 102. The conductive layer may be formed by sequentially stacking a metal nitride layer and a metal layer. Photoresist patterns are formed on the conductive layer. The photoresist patterns may be formed using a semiconductor photolithography process as is known to those of ordinary skill in the art. The photoresist patterns may overlap the first connection holes 102 and expose the conductive layer.

According to one embodiment of the present invention, the conductive layer is etched using the photoresist patterns as an etch mask and using the buried interlayer insulating layer 98 as an etch buffer layer until the buried interlayer insulating layer 98 is exposed. Thus, as shown in FIGS. 9A and 9B, a first cell electrical node 104 is formed in the cell central region A, connection lines 106 are formed in the cell edge region B, and peripheral electrical nodes 108 are formed in the peripheral circuit region P. The peripheral electrical nodes 108 may be formed adjacent to the peripheral gate pattern 73 and brought into contact with the peripheral impurity diffusion regions 89, respectively, through the peripheral active region 18 as shown in FIGS. 1A and 9B. The connection lines 106 may be respectively formed on the cell gates 48 of the cell edge region B and brought into contact with the cell impurity diffusion regions 82 through the cell active regions 16 as shown in FIGS. 1A and 9B. The connection lines 106 can control the internal resistances of the cell gate patterns 59 using the cell impurity diffusion regions 83 of the cell edge region B. This is due to the fact that the cell gate patterns 59 can decrease a parasitic capacitance along with the substrate 5 according to the diffusion extent of the cell impurity diffusion regions 82 of the cell edge region B, compared with the absence of the cell impurity diffusion regions 82. After forming the first cell electrical node 104, the connection lines 106 and peripheral electrical nodes 108, the photoresist patterns are removed from the semiconductor substrate 5.

According to one embodiment of the present invention, the cell impurity diffusion regions 82 prevent the connection lines 106, the cell gate patterns 59, and the semiconductor substrate 5 from contacting one another in the cell edge region B. Thus, the cell impurity diffusion regions 82 can increase a process margin required for forming the connection lines 106. The connection lines 106 function to electrically connect the cell gate patterns 59 with the peripheral active region 18 disposed adjacent to the peripheral gate pattern 73 between the cell array region C and the peripheral circuit region P. The first cell electrical node 104 may be formed between the cell gate patterns 59 of the cell central region A and brought into contact with one of the cell impurity diffusion regions 82 through the cell active region 14 as shown in FIGS. 1A and 9A.

Referring again to FIGS. 1A, 1B, and 9A through 9C, in another embodiment of the present invention, a photoresist layer (not shown) is formed on the buried interlayer insulating layer 98. The photoresist layer may be formed using a semiconductor photolithography process as is known to those of ordinary skill in the art. The photoresist layer may be formed to have openings, which overlap the cell active region 14 of the cell central region A, the gate patterns 59 of the cell edge region B, and the peripheral active region 18 of the peripheral circuit region P and expose the buried interlayer insulating layer 98. The buried interlayer insulating layer 98, the etch stop layer 94, the cell gate capping pattern 58, the pad upper layer 23, and the device isolation layer 12 are etched using the photoresist layer as an etch mask and using the cell active region 14, the peripheral active region 18, and the cell gate patterns 59 as an etch buffer layer so that first connection holes 102 are formed as shown in FIGS. 1B, 9A, and 9C. The first connection holes 102 may be formed to expose the cell active region 14, the peripheral active region 18, and the cell gate patterns 59 of the cell edge region B. More specifically, one of the first connection holes 102 may be formed in the cell edge region B to expose the cell gates 59 and the device isolation layer 12 disposed adjacent to the cell gates 48 and extend from the cell gates 48 toward the semiconductor substrate 5. After forming the first connection holes 102, the photoresist layer is removed from the semiconductor substrate 5.

In another embodiment of the present invention a conductive layer (not shown) is formed on the buried interlayer insulating layer 98 to fill the first connection holes 102. The conductive layer may be formed by sequentially stacking a metal nitride layer and a metal layer. Photoresist patterns are formed on the conductive layer. The photoresist patterns may be formed using a semiconductor photolithography process as is known to those of ordinary skill in the art. The photoresist patterns may overlap the first connection holes 102 and expose the conductive layer. The conductive layer is etched using the photoresist patterns as an etch mask and using the buried interlayer insulating layer 98 as an etch buffer layer until the buried interlayer insulating layer 98 is exposed. Thus, as shown in FIGS. 1B, 9A, and 9C, a first cell electrical node 104 is formed in the cell central region A, connection lines 107 are formed in the cell edge region B, and peripheral electrical nodes 108 are formed in the peripheral circuit region P. After forming the first cell electrical node 104, the connection lines 107 and peripheral electrical nodes 108, the photoresist patterns are removed from the semiconductor substrate 5.

In another embodiment of the present invention, the peripheral electrical nodes 108 may be formed adjacent to the peripheral gate pattern 73 and brought into contact with the peripheral impurity diffusion regions 89, respectively, through the peripheral active region 18 as shown in FIGS. 1B and 9C. The connection lines 107 may be respectively formed on the cell gates 48 of the cell edge region B and brought into contact with the device isolation layer 12 as shown in FIGS. 1B and 9C. The connection lines 107 may substantially surround the cell gates 48 and protrude from the cell gates 48 toward the semiconductor substrate 5. Contact areas of the connection lines 107 with the cell gates 48 are increased through the device isolation layer 12 so that contact resistances between the connection lines 107 and the cell gates 48 can be reduced. The connection lines 107 function to electrically connect the cell gate patterns 59 with the peripheral active region 18 disposed adjacent to the peripheral gate pattern 73 between the cell array region C and the peripheral circuit region P. The first cell electrical node 104 may be formed between the cell gate patterns 59 of the cell central region A and brought into contact with one of the cell impurity diffusion regions 82 through the cell active region 14 as shown in FIGS. 1B and 9A. According to some embodiments of the present invention, the first cell electrical node 104 and the peripheral electrical nodes 108 may be interconnection structures.

Figure 10A:
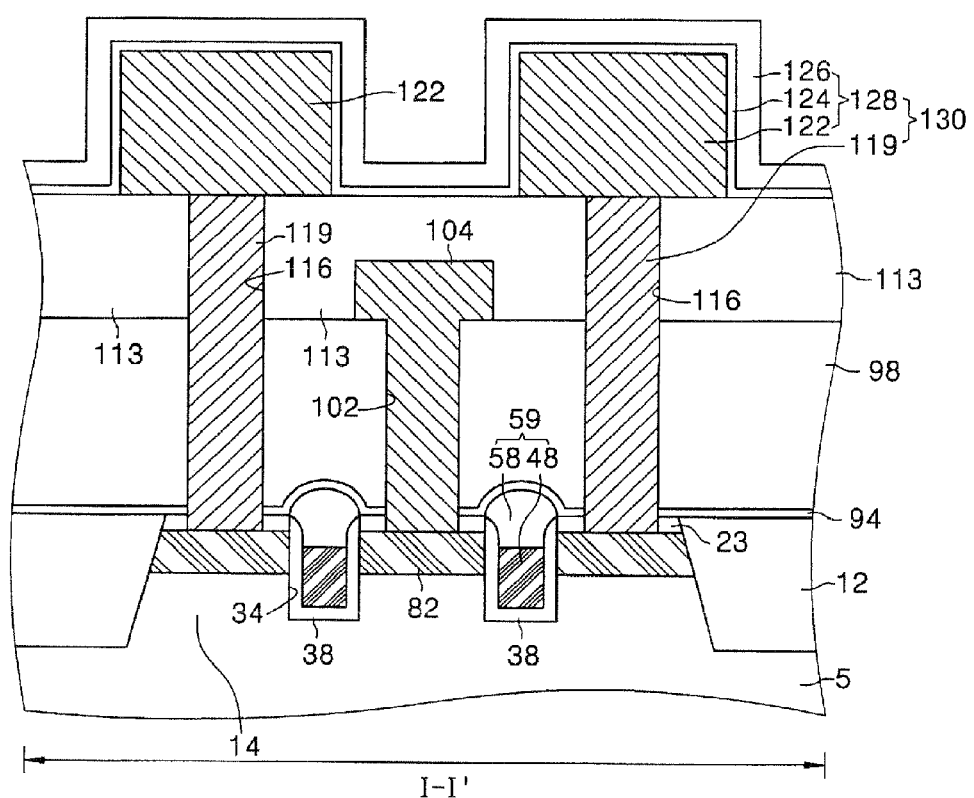
Figure 10B:
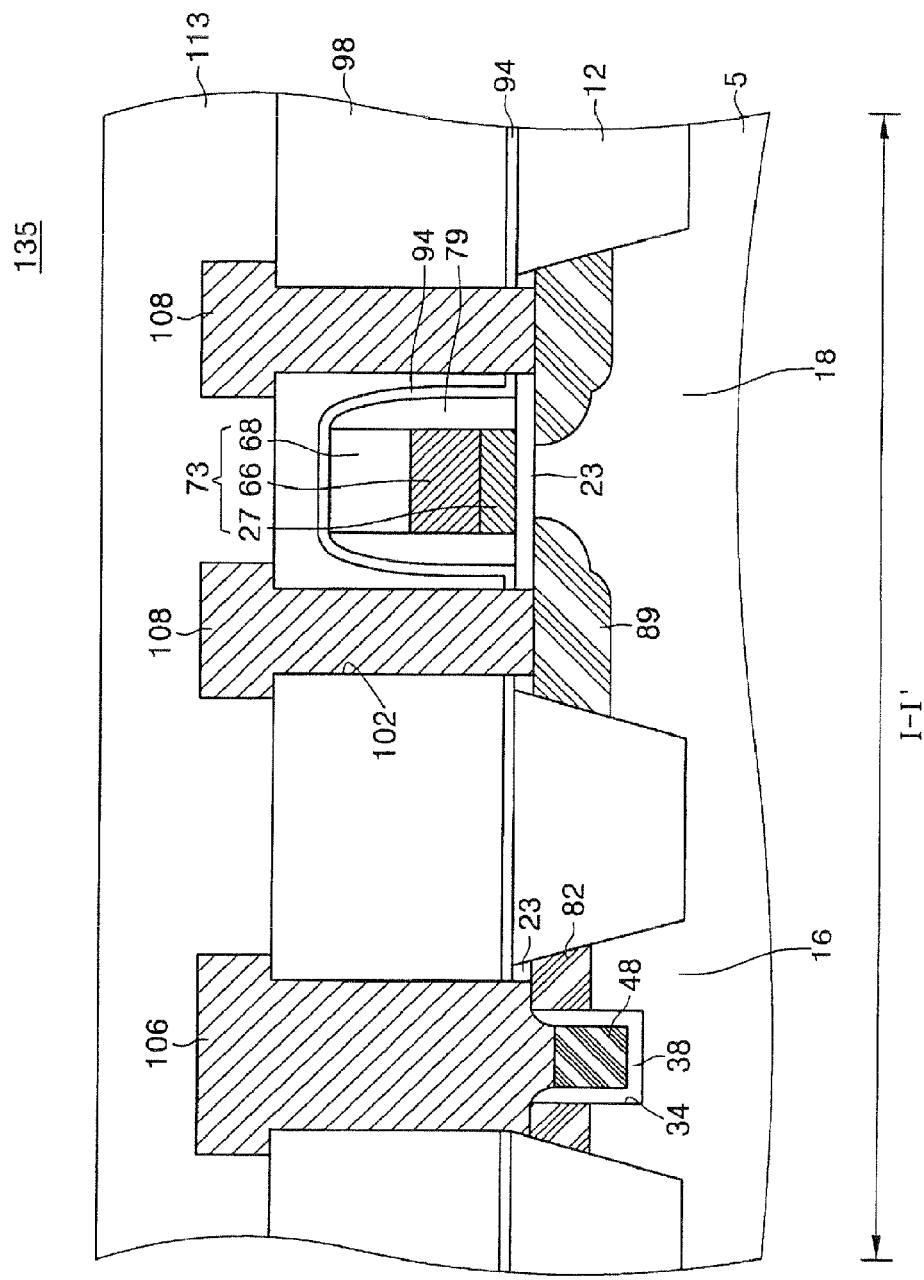
Figure 10C:
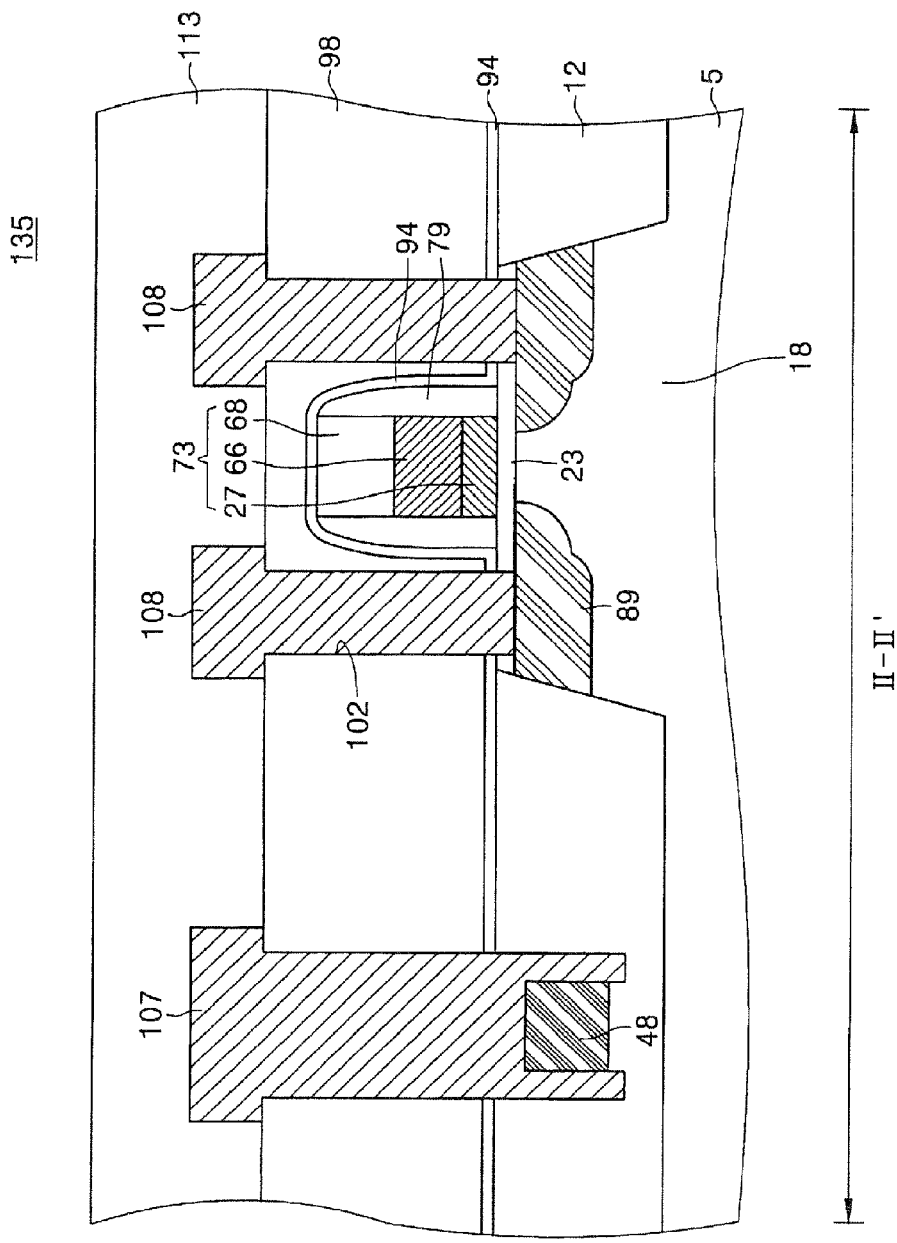

Referring to FIGS. 1A, 1B, and 10A through 10C, according to some embodiments of the present invention, a planarized interlayer insulating layer 113 (refer to FIGS. 10A through 10C) is formed on the buried interlayer insulating layer 98 to cover the first cell electrical node 104, the peripheral electrical nodes 108, and the connection lines 106 or 107. The planarized interlayer insulating layer 113 may be formed of an insulating material containing metal atoms and/or non-metal atoms interposed in a silicon lattice. The planarized interlayer insulating layer 113 may include one or more insulating layers. A photoresist layer (not shown) is formed on the planarized interlayer insulating layer 113. The photoresist layer may be formed using a semiconductor photolithography process as is known to those of ordinary skill in the art. The photoresist layer may be formed to have openings, which are respectively formed on opposite sides of the first cell electrical node 104 in the cell central region A and overlap the cell active region 14 disposed adjacent to the cell gate patterns 59 to expose the planarized interlayer insulating layer 113. The planarized interlayer insulating layer 113, the buried interlayer insulating layer 98, the etch stop layer 94, and the pad upper layer 23 are sequentially etched using the photoresist layer as an etch mask so that second connection holes 116 are formed as shown in FIGS. 1A and 10A. The second connection holes 116 may be formed to expose the cell active region 14 disposed on opposite sides of the first cell electrical node 104 adjacent to the cell gate patterns 59. After forming the second connection holes 116, the photoresist layer is removed from the semiconductor substrate 5.

According to some embodiments of the present invention, second cell electrical nodes 130 are formed to fill the second connection holes 116 as shown in FIGS. 1A and 10A. The second cell electrical nodes 130 may be storage structures, which are in contact with the remaining cell impurity diffusion regions 82 through the cell active region 14 by interposing the first cell electrical node 104 therebetween. According to some embodiments of the present invention, the first and second cell electrical nodes 104 and 130 constitute the semiconductor IC device 135 along with the connection lines 106 or 107, the cell gate patterns 59, and the peripheral gate pattern 73. When the semiconductor IC device 135 is a DRAM device, the storage structure may include a node plug 119 and a capacitor 128 which are sequentially stacked as shown in FIG. 10A. The capacitor 128 may include a lower electrode 122, a dielectric layer 124, and an upper electrode 126. Each of the upper electrode 126, the lower electrode 122, and the node plug 119 may be formed of a conductive layer. When the semiconductor IC device 135 is a PRAM device, the storage structure may be formed of a phase-change material. Also, when the semiconductor IC device 135 is an FRAM device, the storage structure may be formed of a ferroelectric material. The second cell electrical nodes 130 may be interconnection structures. The interconnection structure may be a bit line pattern or another circuit interconnection line. The interconnection structure may be a conductive layer.

As explained above, embodiments of the present invention provide semiconductor IC devices including gate patterns with a step difference therebetween disposed in a cell array region and a peripheral circuit region and a connection line interposed between the gate patterns. By forming the gate patterns having the step difference therebetween in the cell array region and the peripheral circuit region and forming the connection lines between the cell array region and the peripheral circuit region using different process operations, the current drivability of the semiconductor IC device can be improved, compared with the conventional methods.

An embodiment of the present invention provides semiconductor integrated circuit (IC) devices including gate patterns having a step difference therebetween relative to top surfaces of active regions disposed in a cell array region and a peripheral circuit region and a connection line disposed between the gate patterns.

Another embodiment of the present invention provides methods of fabricating semiconductor IC devices including gate patterns disposed in a cell array region and a peripheral circuit region and connection lines disposed between the gate patterns through sequential process operations.

In one aspect, the present invention is directed to a semiconductor IC device including gate patterns having a step difference therebetween and connection lines interposed between the gate patterns. The semiconductor IC device includes a semiconductor substrate having a peripheral circuit region and a cell array region. The cell array region comprises a cell edge region and a cell central region. The cell central region is substantially surrounded by the cell edge region. The cell edge region is substantially surrounded by the peripheral circuit region. A device isolation layer is disposed in the peripheral circuit region, the cell edge region, and the cell central region. The device isolation layer defines cell active regions in the cell central region and the cell edge region and defines a peripheral active region in the peripheral circuit region. A peripheral gate pattern is disposed on the peripheral active region of the peripheral circuit region. The peripheral gate pattern extends upward from a top surface of the peripheral active region. Cell gate patterns are disposed respectively in the cell active regions of the cell central region and the cell edge region. The cell gate patterns protrude into the cell active regions, respectively. A connection line contacts the cell gate pattern and the cell active region of the cell edge region.

In another aspect, the present invention is directed to a semiconductor IC device including a semiconductor substrate having a peripheral circuit region and a cell array region. The cell array region comprises a cell edge region and a cell central region. The cell central region is substantially surrounded by the cell edge region. The cell edge region is substantially surrounded by the peripheral circuit region. A device isolation layer is disposed in the peripheral circuit region, the cell edge region, and the cell central region. The device isolation layer defines a cell active region in the cell central region and defines a peripheral active region in the peripheral circuit region. A peripheral gate pattern is disposed on the peripheral active region of the peripheral circuit region. The peripheral gate pattern extends upward from a top surface of the peripheral active region. Cell gate patterns are disposed in the cell active region of the cell central region and the device isolation layer of the cell edge region. The cell gate patterns protrude into the device isolation layer. A connection line contacts the cell gate pattern and the device isolation layer of the cell edge region.

In yet another aspect, the present invention is directed to a method of fabricating a semiconductor IC device including preparing a semiconductor substrate having a peripheral circuit region and a cell array region. The cell array region comprises a cell central region and a cell edge region. The cell central region is substantially surrounded by the cell edge region. The cell array region is substantially surrounded by the peripheral circuit region. A device isolation layer is formed in the cell array region and the peripheral circuit region. The device isolation layer is formed to define a peripheral active region in the peripheral circuit region and define cell active regions in the cell central region and the cell edge region. Cell gate patterns are formed in the cell active regions, respectively, and protrude into the cell active regions, respectively. A peripheral gate pattern is formed on the peripheral active region and extends upward from a top surface of the peripheral active region. A buried interlayer insulating layer is formed on the semiconductor substrate to cover the peripheral gate pattern and the cell gate patterns. Peripheral electrical nodes are formed through the buried interlayer insulating layer on the peripheral active region adjacent to the peripheral gate pattern. A connection line is formed on the cell gate patterns and the cell active region of the cell edge region. A first cell electrical node is formed on the cell active region adjacent to the cell gate pattern of the cell central region.

In still another aspect, the present invention is directed to a method of fabricating a semiconductor IC device including: preparing a semiconductor substrate having a peripheral circuit region and a cell array region. The cell array region comprises a cell edge region and a cell central region. The cell central region is substantially surrounded by the cell edge region. The cell array region is substantially surrounded by the peripheral circuit region. A device isolation layer is formed in the cell array region and the peripheral circuit region. The device isolation layer is formed to define a peripheral active region in the peripheral circuit region and define a cell active region in the cell central region. Cell gate patterns are formed in the cell active region of the cell central region and the device isolation layer of the cell edge region. The cell gate patterns protrude into the cell active region and the device isolation layer. A peripheral gate pattern is formed on the peripheral active region. The peripheral gate pattern extends upward from a top surface of the peripheral active region. A buried interlayer insulating layer is formed on the semiconductor substrate to cover the peripheral gate pattern and the cell gate patterns. Peripheral electrical nodes are formed through the buried interlayer insulating layer on the peripheral active region adjacent to the peripheral gate pattern. A connection line is formed on the cell gate pattern and the device isolation layer of the cell edge region. A first cell electrical node is formed on the cell active region adjacent to the cell gate pattern of the cell central region.

Exemplary embodiments of the present invention have been disclosed herein and, although specific terms are employed, they are used and are to be interpreted in a generic and descriptive sense only and not for purposes of limitation. Accordingly, it will be understood by those of ordinary skill in the art that various changes in form and details may be made without departing from the spirit and scope of the present invention as set forth in the following claims.

What is claimed is:

1. A semiconductor device comprising:
    a semiconductor substrate comprising a cell array region including a cell central region and a cell edge region, and a peripheral circuit region;
    cell gate patterns extending from the cell central region to the cell edge region, each comprising a cell gate capping pattern on a cell gate in the cell central region, wherein an upper surface of a cell gate in the cell edge region is beneath a surface of a device isolation layer;
    an interlayer insulating layer on the cell edge region and on the peripheral circuit region, having a contact hole extending therethrough into the device isolation layer in the cell edge region, exposing a portion of the upper surface of the cell gate in the cell edge region; and
    a connection line in the contact hole extending through the interlayer insulating layer and into the device isolation layer to contact an entire width of the portion of the upper surface of the cell gate in the cell edge region, and wherein the connection line contacts the device isolation layer.

2. The device of claim 1 wherein the interlayer insulating layer is planar extending from the cell edge region to the peripheral circuit region.

3. The device of claim 1 further comprising:
    a peripheral gate pattern on an active region in the peripheral circuit region and on first and second peripheral impurity diffusion regions in the active region;
    a first peripheral electrical node extending through the interlayer insulating layer to contact one of the first and second peripheral impurity diffusion regions, wherein the first peripheral electrical node and the connection line comprise a common layer.

4. The device of claim 3 wherein the peripheral gate pattern comprises a peripheral gate lower pattern, a peripheral gate upper pattern, and a peripheral gate capping pattern; and
    wherein an upper surface of the peripheral gate lower pattern and an upper surface of the cell gate capping pattern are at equal heights.

5. The device of claim 3 wherein the interlayer insulating layer extends to the cell central region, the device further comprising:
    first and second cell array transistors in the cell central region, beneath the interlayer insulating layer, including the cell gate patterns and associated cell impurity diffusion regions to provide a common cell impurity diffusion region for the first and second cell array transistors; and
    a bit line structure, extending through the interlayer insulating layer to contact the common cell impurity diffusion region.

6. The device of claim 5 wherein the bit line structure comprises the common layer.

7. The device of claim 1 wherein the cell gate capping patterns protrude from an uppermost surface of the substrate.

8. The device of claim 1 wherein the device isolation layer in the cell edge region extends to the peripheral circuit region and defines a first active region in the cell central region and a second active region in the peripheral circuit region.

9. The device of claim 1, wherein the contact hole exposes an entire width of the upper surface of the cell gate pattern in the cell edge region.

10. The device of claim 9, wherein the connection line is in contact with the entire width of the upper surface of the cell gate pattern in the cell edge region.

11. A semiconductor device comprising:
a semiconductor substrate comprising a cell array region including a cell central region and a cell edge region, and a peripheral circuit region;
first and second directly adjacent cell gate patterns on the substrate, each comprising a cell gate capping pattern on a cell gate in the cell central region, extending from the cell central region to the cell edge region, wherein portions of upper surfaces of the cell gates in the cell edge region are free of the cell gate capping pattern to provide first and second exposed upper surfaces of the cell gates beneath a surface of a device isolation layer in the cell edge region;
an interlayer insulating layer on the cell central region, the cell edge region and on the peripheral circuit region;
a first connection line extending through the interlayer insulating layer into the device isolation layer to contact an entire width of the first exposed upper surface on a first side of the cell central region and the device isolation layer; and
a second connection line extending through the interlayer insulating layer into the device isolation layer to contact an entire width of the second exposed upper surface on a second side of the cell central region and the device isolation layer, opposite the first side.

12. The device of claim 11 further comprising:
first and second cell array transistors in the cell central region, including the first and second directly adjacent cell gate patterns, respectively, and associated cell impurity diffusion regions to provide a common cell impurity diffusion region for the first and second cell array transistors between the first and second directly adjacent cell gate patterns.

13. The device of claim 11 further comprising:
an active region in the cell array region, wherein the first and second directly adjacent cell gate patterns cross over the active region to form acute angles relative to a boundary of the active region.

14. A random access memory device comprising:
a semiconductor substrate comprising a cell array region including a cell central region and a cell edge region, and a peripheral circuit region substantially surrounding the cell array region;
a cell gate pattern on the substrate, extending from the cell central region to the cell edge region, the cell gate pattern comprising a cell gate capping pattern on a cell gate beneath a surface of an active region in the cell central region, wherein a portion of an upper surface of the cell gate in the cell edge region is free of the cell gate capping pattern to expose an entire width of the upper surface of the portion beneath a surface of a device isolation layer in the cell edge region;
a cell array transistor in the cell central region, including the cell gate pattern, and associated cell impurity diffusion regions;
an interlayer insulating layer on the cell central region, the cell edge region and the peripheral circuit region; and a connection line extending through the interlayer insulating layer to contact the entire width of the exposed upper surface of the cell gate in the cell edge region.

15. The device of claim 14 further comprising:
a bit line pattern, extending through the interlayer insulating layer to contact a first of the associated cell impurity diffusion regions.

16. The device of claim 15, wherein the interlayer insulating layer comprises a first interlayer insulating layer, the device further comprising:
a second interlayer insulating layer on the first interlayer insulating layer, wherein an uppermost surface of the bit line pattern is buried in the second interlayer insulating layer; and
an electrical node, extending from a surface of the second interlayer insulating layer through the second interlayer insulating layer and through the first interlayer insulating layer to contact a second of the associated cell impurity diffusion regions.

17. The device of claim 16 further comprising:
a storage structure on the second interlayer insulating layer electrically connected to the electrical node.

18. The device of claim 17 wherein the storage structure comprises a capacitor, a phase-change material, or a ferroelectric material.

19. The device of claim 17 wherein an uppermost level of the connection line is located beneath the storage structure.

20. The device of claim 14 further comprising:
a planar transistor in the peripheral circuit region on an upper surface of an active region in the peripheral circuit region.

21. The device of claim 14 wherein the cell gate capping pattern protrudes from a surface of an active region in the cell central region and at least a portion of the cell gate is beneath the surface of the active region in the cell central region.

22. A semiconductor device comprising:
a semiconductor substrate comprising a cell array region including a cell central region and a cell edge region, and a peripheral circuit region;
cell gate patterns extending from the cell central region to the cell edge region, each comprising a cell gate capping pattern on a cell gate in the cell central region, wherein an upper surface of a cell gate in the cell edge region is beneath a surface of a device isolation layer;
an interlayer insulating layer on the cell edge region and on the peripheral circuit region, having a contact hole extending therethrough into the device isolation layer in the cell edge region so that portions of the device isolation layer form side walls of the contact hole, wherein the contact hole exposes a portion of an upper surface of the cell gate in the cell edge region and wherein the contact hole is wider than an entire width of the portion of the cell gate exposed by the contact hole; and
a connection line in the contact hole extending through the interlayer insulating layer and into the device isolation layer to contact an entire width of the portion of the upper surface of the cell gate in the cell edge region.

23. A semiconductor device comprising:
a semiconductor substrate comprising a cell array region including a cell central region and a cell edge region, and a peripheral circuit region;
first and second directly adjacent cell gate patterns on the substrate, each comprising a cell gate capping pattern on a cell gate in the cell central region, extending from the cell central region to the cell edge region, wherein entire upper surfaces of cell gates in the cell edge region are free of the cell gate capping pattern to provide first and second exposed upper surfaces of the cell gates in the cell edge region beneath a surface of a device isolation layer in the cell edge region;

an interlayer insulating layer on the cell central region, the cell edge region and on the peripheral circuit region having first and second contact holes extending therethrough into the device isolation layer in the cell edge region so that portions of the device isolation layer form side walls of the first and second contact holes, wherein the first and second contact holes are wider than first and second exposed upper surfaces of the cell gates in the cell edge region, respectively;

a first connection line in the first contact hole extending through the interlayer insulating layer into the device isolation layer to contact the first exposed upper surface on a first side of the cell central region; and a second connection line in the second contact hole extending through the interlayer insulating layer into the device isolation layer to contact the second exposed upper surface on a second side of the cell central region, opposite the first side.

\* \* \* \* \*